United States Patent
Kitamura et al.

(10) Patent No.: US 11,635,770 B2
(45) Date of Patent: Apr. 25, 2023

(54) TRAVELING VEHICLE SYSTEM AND TRAVELING VEHICLE CONTROL METHOD

(71) Applicant: Murata Machinery, Ltd., Kyoto (JP)

(72) Inventors: Wataru Kitamura, Inuyama (JP); Masahiro Ikeda, North Salt Lake, UT (US); Eijiro Aoki, Inuyama (JP); Toshikazu Nakagawa, Inuyama (JP)

(73) Assignee: Murata Machinery, Ltd., Kyoto (JP)

( * ) Notice: Subject to any disclaimer, the term of this patent is extended or adjusted under 35 U.S.C. 154(b) by 0 days.

(21) Appl. No.: 17/626,157

(22) PCT Filed: May 29, 2020

(86) PCT No.: PCT/JP2020/021297
§ 371 (c)(1),
(2) Date: Jan. 11, 2022

(87) PCT Pub. No.: WO2021/010035
PCT Pub. Date: Jan. 21, 2021

(65) Prior Publication Data
US 2022/0244742 A1  Aug. 4, 2022

(30) Foreign Application Priority Data

Jul. 12, 2019 (JP) .............................. JP2019-130470

(51) Int. Cl.
*G05D 1/02* (2020.01)
*G05D 1/00* (2006.01)

(52) U.S. Cl.
CPC ......... *G05D 1/0289* (2013.01); *G05D 1/0027* (2013.01); *G05D 1/0214* (2013.01); *G05D 2201/0216* (2013.01)

(58) Field of Classification Search
CPC .. G05D 1/0289; G05D 1/0027; G05D 1/0214; G05D 2201/0216; G08G 1/14; G08G 1/168
See application file for complete search history.

(56) References Cited

U.S. PATENT DOCUMENTS 5,283,739 A * 2/1994 Summerville ....... G05D 1/0289
700/255
5,625,559 A 4/1997 Egawa
(Continued)

FOREIGN PATENT DOCUMENTS

JP  H07-219633 A  8/1995
JP  2006-313461 A  11/2006
(Continued)

*Primary Examiner* — Dalena Tran
(74) *Attorney, Agent, or Firm* — DLA Piper LLP (US)

(57) ABSTRACT

A controller determines, when a traveling vehicle to proceed in a first direction from a predetermined cell toward a destination is present, whether or not to grant the traveling vehicle occupation permission for a cell adjacent to the predetermined cell in the first direction. The traveling vehicle proceeds in the first direction if occupation permission for the adjacent cell has been granted from the controller, whereas the traveling vehicle stops at the predetermined cell if occupation permission has not been granted. The controller assigns to the traveling vehicle a traveling instruction in which a cell situated at a plurality of cells ahead of the predetermined cell in the second direction is designated as a waypoint to the destination if the traveling vehicle has not obtained occupation permission for the adjacent cell and has continuously been in a stop state at the predetermined cell for a predetermined period of time.

4 Claims, 16 Drawing Sheets

(56) References Cited

U.S. PATENT DOCUMENTS

| | | | |
|---|---|---|---|
| 7,920,962 B2* | 4/2011 | D'Andrea | G05D 1/0212 |
| | | | 701/410 |
| 10,956,855 B1* | 3/2021 | Coughran | G06Q 10/047 |
| 2014/0032035 A1* | 1/2014 | Thomson | G01C 21/206 |
| | | | 701/25 |
| 2014/0236413 A1 | 8/2014 | D'Andrea et al. | |
| 2017/0169366 A1* | 6/2017 | Klein | G06Q 10/047 |
| 2020/0039747 A1* | 2/2020 | Ahmann | G06Q 10/08 |
| 2020/0343118 A1 | 10/2020 | Torazawa et al. | |

FOREIGN PATENT DOCUMENTS

| | | |
|---|---|---|
| JP | 5052606 B2 | 10/2012 |
| JP | 2017-134794 A | 8/2017 |
| WO | 2019/087618 A1 | 5/2019 |

* cited by examiner

TRAVELING VEHICLE SYSTEM AND TRAVELING VEHICLE CONTROL METHOD

TECHNICAL FIELD

This disclosure relates to a traveling vehicle system, and a traveling vehicle control method.

BACKGROUND

In semiconductor manufacturing factories, a traveling vehicle system for transporting articles such as transportation containers (FOUPs, reticle pods) that contain semiconductor wafers or reticles is used. A traveling vehicle system that includes a plurality of traveling vehicles traveling on a track and a controller for controlling the plurality of traveling vehicles is known as such a traveling vehicle system. Each of the plurality of traveling vehicles transmits information such as its current location to the controller by wireless communication or the like. The controller determines a traveling vehicle that handles transportation of an article on the basis of the location of the traveling vehicle, and transmits a traveling instruction to the traveling vehicle.

The track used in the above traveling vehicle system typically has a plurality of intersections. For each intersection, a blocking section is designated which undergoes, when occupied by one of a plurality of traveling vehicles, exclusive control to prohibit another traveling vehicle from moving thereinto. The traveling vehicle is controlled to be allowed to pass through the blocking section when occupation permission for the blocking section is granted by the controller while being prohibited to move into the blocking section when occupation permission is not granted by the controller. As the exclusive control mentioned above, a technique has been disclosed in which if passage permission for a blocking section is not obtained within a predetermined period of time, the request therefor is changed to a permission request for passage in another direction (for example, see Japanese Unexamined Patent Application, First Publication No. 2006-313461).

In the traveling vehicle system mentioned above, when traveling vehicles become congested on a part of the track, a so-called deadlock may occur in which a following traveling vehicle is unable to move until the leading traveling vehicle of the congestion has moved. In the configuration disclosed in JP '461, even when, if permission for passage in another direction is granted, a traveling vehicle may not be able to move sufficiently away from the location of the congestion. As a result, when passing through the vicinity of congested traveling vehicles, the traveling vehicle may be affected by the congestion and may not be able to travel smoothly.

It could therefore be helpful to provide a traveling vehicle system and a traveling vehicle control method capable of suppressing a deadlock from occurring by mitigating congestion of traveling vehicles.

SUMMARY

A traveling vehicle system comprises: a plurality of traveling vehicles; a track in which a plurality of first tracks extending in a first direction and a plurality of second tracks extending in a second direction intersecting with the first direction are provided in a grid pattern, and on which the traveling vehicles can selectively proceed either in the first direction or in the second direction; and a controller capable of communicating mutually with the plurality of traveling vehicles and that controls the plurality of traveling vehicles. The controller can set either an occupied state in which occupation permission is granted to a predetermined traveling vehicle or an unoccupied state in which occupation permission is not granted to any traveling vehicle to each cell that is defined by two first tracks adjacent to each other and two second tracks adjacent to each other as seen in a plan view. The controller determines, when the traveling vehicle that is to proceed in the first direction from the predetermined cell toward a destination is present, whether or not to grant the traveling vehicle occupation permission for the cell adjacent to the predetermined cell in the first direction. The traveling vehicle proceeds in the first direction if occupation permission for the adjacent cell has been granted from the controller, whereas the traveling vehicle stops at the predetermined cell if occupation permission has not been granted the controller assigns to the traveling vehicle a traveling instruction in which the cell situated at a plurality of cells ahead of the predetermined cell in the second direction is designated as a waypoint to the destination if the traveling vehicle has not obtained occupation permission for the adjacent cell and has continuously been in a stop state at the predetermined cell for a predetermined period of time.

When the traveling vehicle has not obtained occupation permission for the adjacent cell and has continuously been in a stop state at the predetermined cell for a predetermined period of time, if the cell situated at a first predetermined number of cells ahead of the predetermined cell in the second direction cannot be set as the waypoint, or if the traveling vehicle cannot proceed to the cell serving as the waypoint, which is situated at the first predetermined number of cells ahead of the predetermined cell in the second direction, the controller may assign to the traveling vehicle a traveling instruction in which a cell situated at a second predetermined number, which is less than the first predetermined number, of cells ahead of the predetermined cell in the second direction is designated as the waypoint. When the traveling vehicle has not obtained occupation permission for the adjacent cell and has continuously been in a stop state at the predetermined cell for a predetermined period of time, the controller may cancel a traveling instruction to the destination that has been assigned to the traveling vehicle while maintaining the traveling instruction under management of its own. When the traveling vehicle has reached or approached the waypoint, the controller may assign to the traveling vehicle a traveling instruction from the waypoint to the destination designated in the canceled traveling instruction.

A traveling vehicle control method is a method of controlling a traveling vehicle in a traveling vehicle system including a plurality of traveling vehicles, and a track in which a plurality of first tracks extending in a first direction and a plurality of second tracks extending in a second direction intersecting with the first direction are provided in a grid pattern, and on which the traveling vehicles can selectively proceed either in the first direction or in the second direction, and the method comprising: setting either an occupied state in which occupation permission is granted to a predetermined traveling vehicle or an unoccupied state in which occupation permission is not granted to any traveling vehicle to each cell that is defined by two first tracks adjacent to each other and two second tracks adjacent to each other as seen in a plan view; determining, when the traveling vehicle that is to proceed in the first direction from the predetermined cell toward a destination is present, whether or not to grant the traveling vehicle occupation permission for the cell adjacent to the predetermined cell in the first direction; causing the traveling vehicle to proceed in the first direction if occupation permission for the adjacent cell has been granted to the traveling vehicle, and causing the traveling vehicle to stop at the predetermined cell if occupation permission for the adjacent cell has not been granted to the traveling vehicle; and assigning to the traveling vehicle a traveling instruction in which the cell situated at a plurality of cells ahead of the predetermined cell in the second direction is designated as a waypoint to the destination if the traveling vehicle has not obtained occupation permission for the adjacent cell and has continuously been in a stop state at the predetermined cell for a predetermined period of time.

According to the traveling vehicle system and the traveling vehicle control method mentioned above, when the traveling vehicle proceeding in the first direction has not obtained occupation permission for the adjacent cell and has continuously been in a stop state at the predetermined cell for a predetermined period of time, the traveling vehicle is to proceed to the cell situated at a plurality of cells ahead in the second direction, according to the control of the controller. Therefore, it is possible to suppress the traveling vehicle from not being granted occupation permission for the adjacent cell and stopping in one cell continuously for a predetermined period of time or longer. As a result, it is possible to separate the traveling vehicle caught in congestion from the location of the congestion to some extent, and suppress a deadlock from occurring by mitigating congestion of traveling vehicles on a grid-patterned track.

With the configuration in which the traveling vehicle has not obtained occupation permission for the adjacent cell and has continuously been in a stop state at the predetermined cell for a predetermined period of time, if the cell situated at a first predetermined number of cells ahead of the predetermined cell in the second direction cannot be set as a waypoint, or if the traveling vehicle cannot proceed to the waypoint, which is situated at the first predetermined number of cells ahead of the predetermined cell in the second direction, the controller assigns to the traveling vehicle a traveling instruction in which a cell situated at a second predetermined number, which is less than the first predetermined number, of cells ahead of the predetermined cell in the second direction is designated as a waypoint, if the cell situated at the first predetermined number of cells ahead cannot be set as a waypoint for reasons such as track layout or route closure, or even if the traveling vehicle cannot proceed to the waypoint, which is the cell situated at the predetermined number of cells ahead, for reasons such as presence of another traveling vehicle, the traveling instruction that designates the cell situated at the second predetermined number of cells ahead as a waypoint makes it possible to reliably cause the traveling vehicle to proceed from the cell where it has been in a stop state.

With the configuration in which the traveling vehicle has not obtained occupation permission for the adjacent cell and has continuously been in a stop state at the predetermined cell for a predetermined period of time, the controller cancels a traveling instruction to the destination that has been assigned to the traveling vehicle while maintaining the traveling instruction under management of its own, the canceled traveling instruction is maintained under management of its own, and it is therefore possible to easily generate a traveling instruction from the waypoint to the final destination, which is the above destination. With the configuration in which when the traveling vehicle has reached or approached the waypoint, the controller assigns to the traveling vehicle a traveling instruction from the waypoint to the destination designated in the canceled traveling instruction, it is possible to cause the traveling vehicle to smoothly proceed to the original destination while mitigating congestion of traveling vehicles.

DESCRIPTION OF REFERENCE SIGNS

Figure 1:
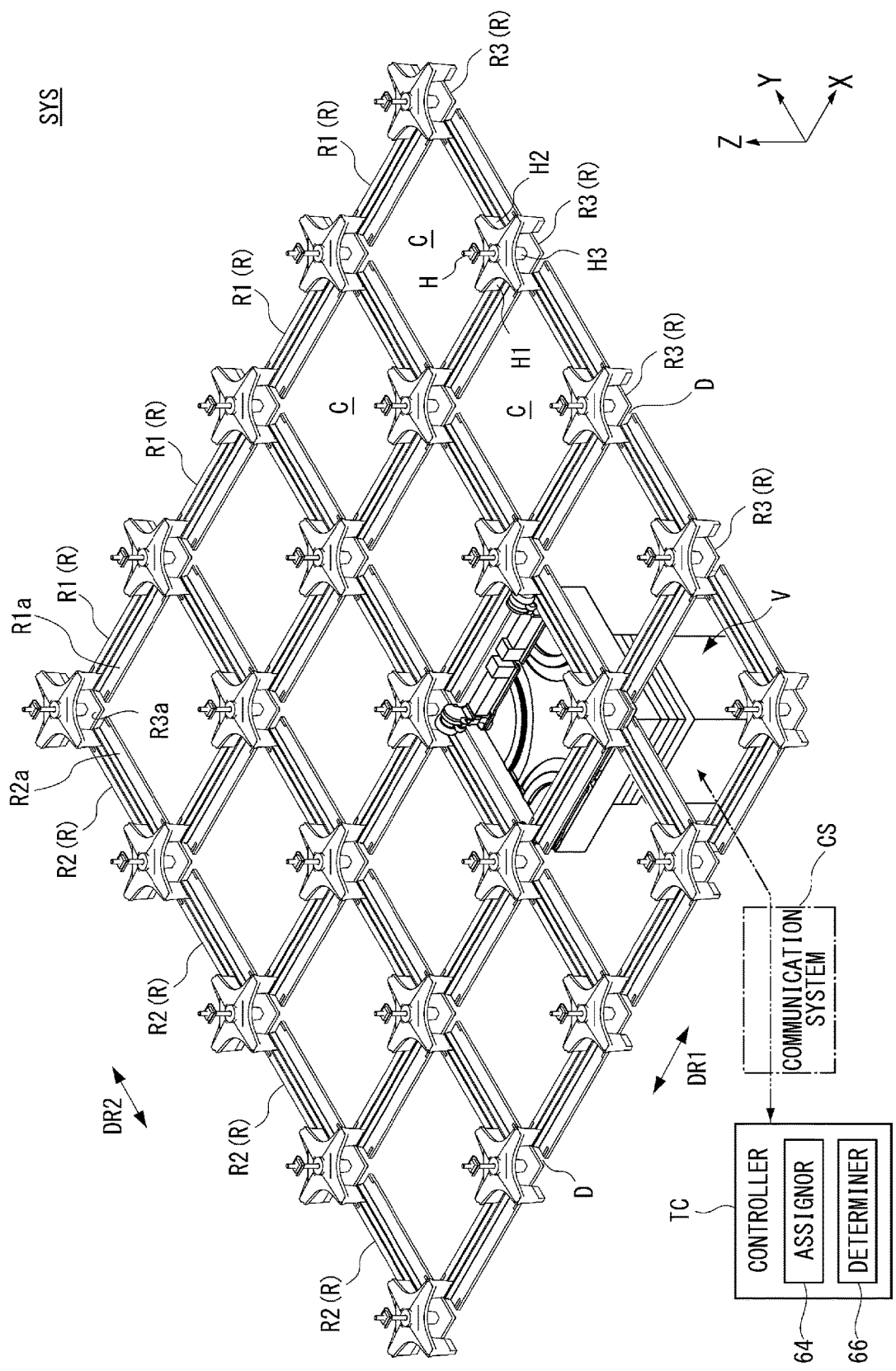
FIG. 1 is a perspective view showing an example of a traveling vehicle system.

A: State information
C (C1 to C120): Grid cell (cell)
V, V1 to V8: Traveling vehicle
M: Article
R: Grid-patterned track (track)
R1: First track
R2: Second track
W: Cover
CM, CM1 to CM7: Traveling instruction
DR1: First direction
DR2: Second direction
TC: Controller
VC: In-vehicle controller
SYS: Traveling vehicle system
10: Main body
20: Traveler
51, 61: Memory storage
52, 62: Communicator
53: Traveling controller 54: Transfer controller
55: State information processor
56: Occupation permission requester
63: Traveling instruction generator
64: Assignor
65: State information requester
66: Occupation permission determiner
67: Determiner
68: Timer

DETAILED DESCRIPTION

The following describes an example of our systems and methods with reference to the drawings. However, this disclosure is not limited to the example. In the drawings, scale is changed as necessary to illustrate the example such as by enlarging or emphasizing a portion. In the following drawings, an XYZ coordinate system is used to describe the directions in each figure. In the XYZ coordinate system, a plane that is parallel to a horizontal plane is defined as an XY plane. A direction along this XY plane is denoted as X direction, and a direction orthogonal to the X direction is denoted as Y direction. The traveling direction of the traveling vehicle V can change from the state shown in the following figures to another direction, and may also travel along, for example, a curved direction in some instances. A direction perpendicular to the XY plane is denoted as Z direction. For each of the X direction, the Y direction, and the Z direction, description is made with a definition in which a direction indicated by an arrow is the positive (+) direction and a direction opposite to the direction indicated by the arrow is the negative (−) direction. Moreover, the pivoting direction around the vertical axis or the Z axis is referred to as OZ direction.

Figure 2:
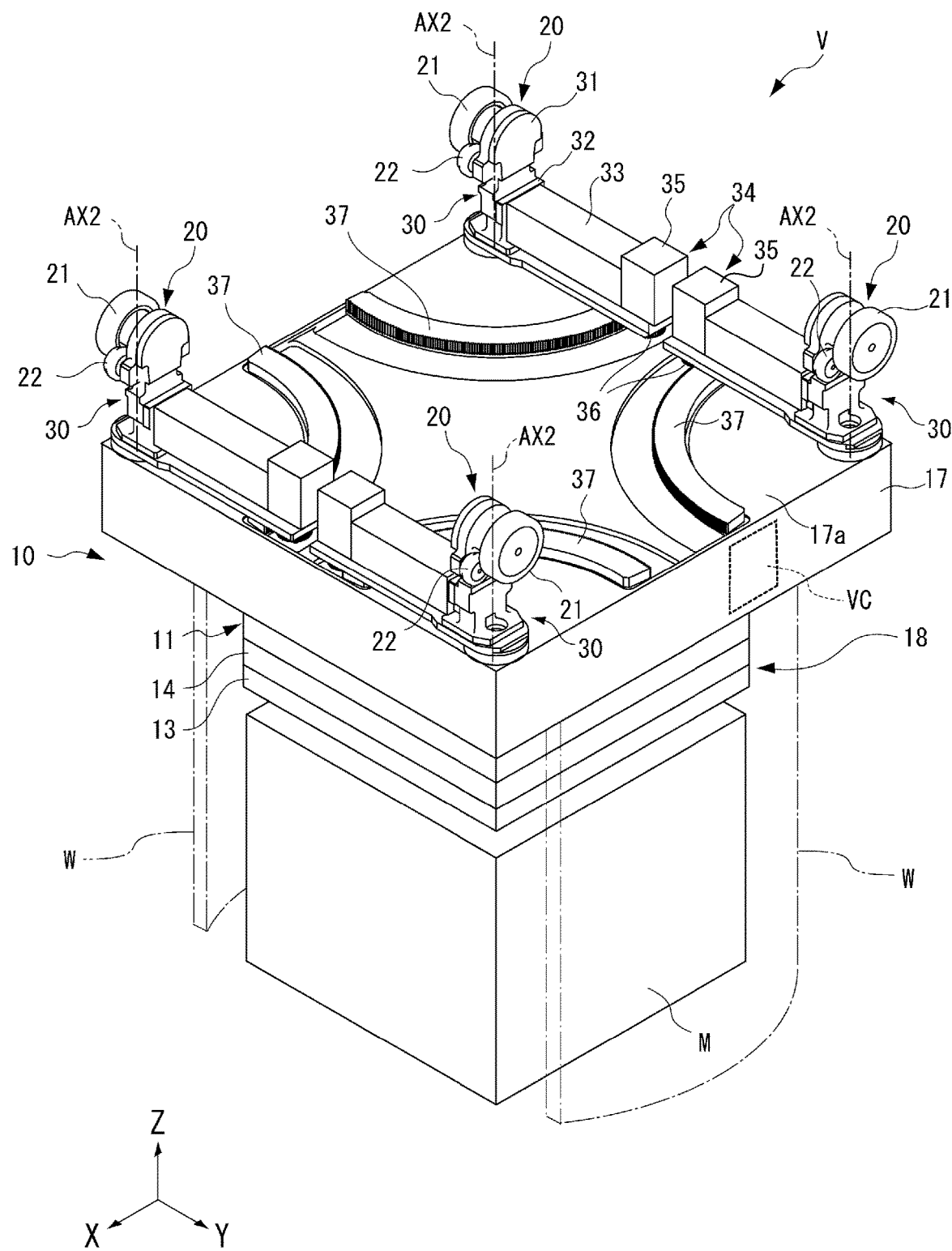
FIG. 2 is a perspective view showing an example of a traveling vehicle.
Figure 3:
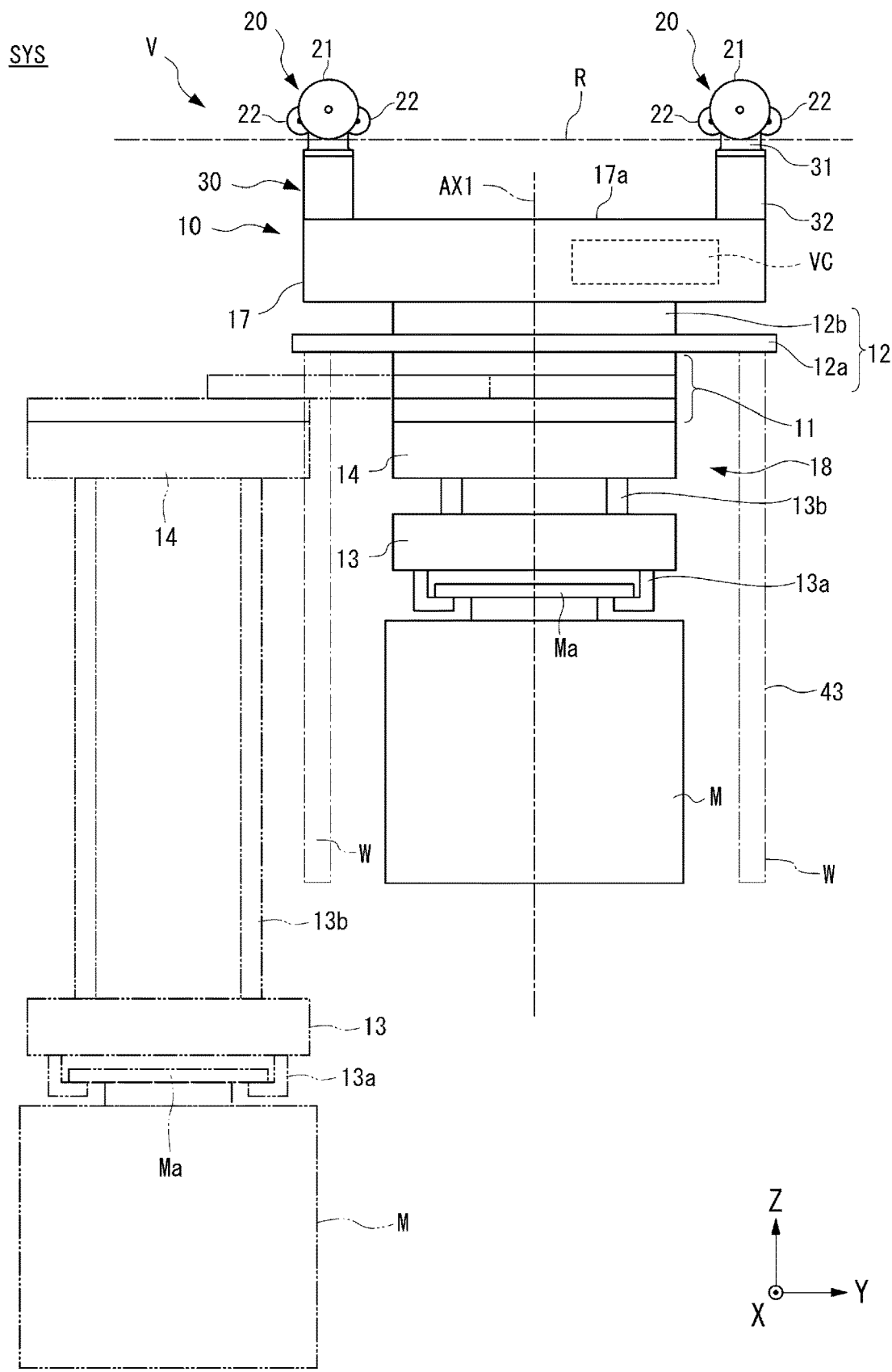
FIG. 3 is a side view showing an example of the traveling vehicle.
Figure 4:
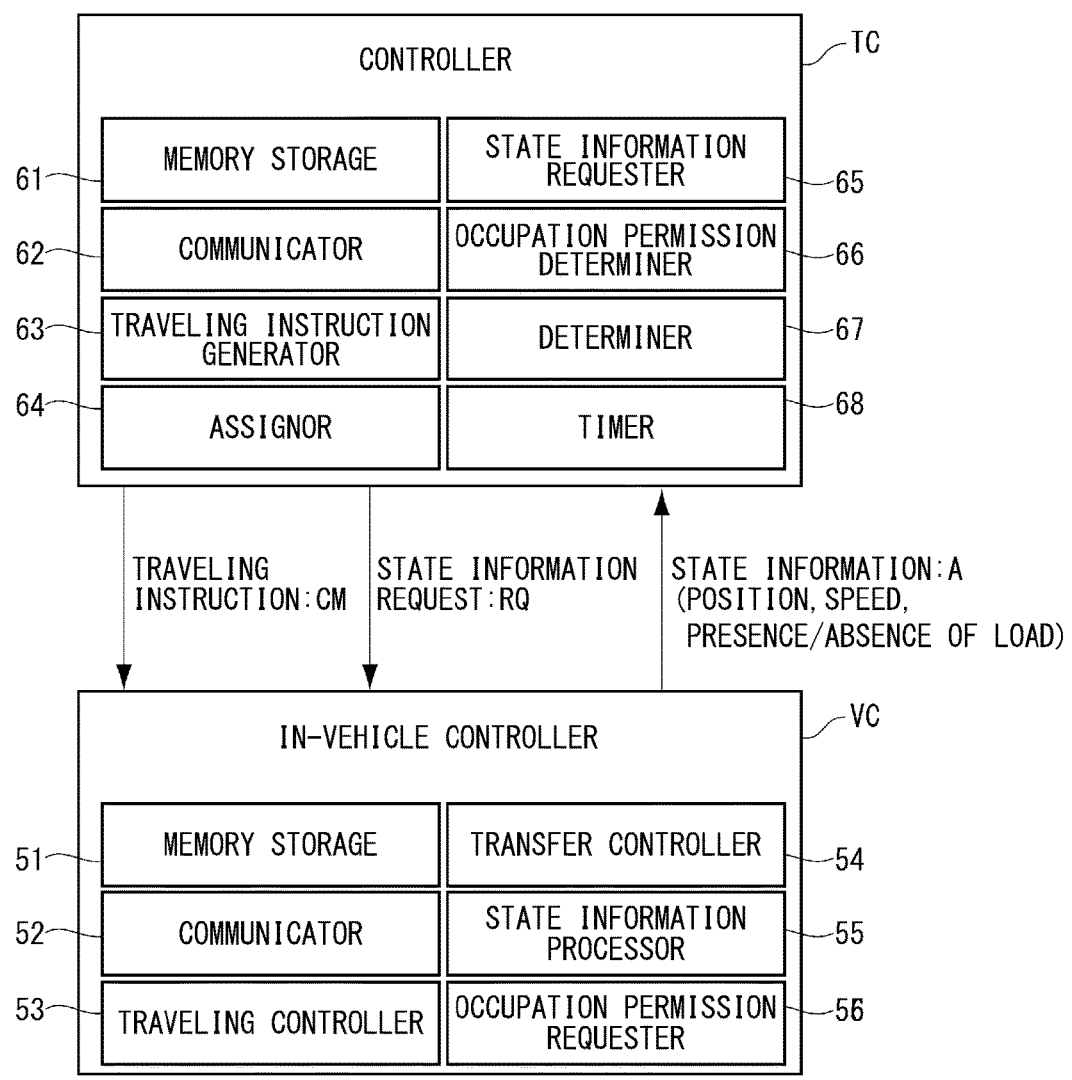
FIG. 4 is a functional block diagram showing an example of a controller and an in-vehicle controller.

FIG. 1 is a perspective view showing an example of a traveling vehicle system SYS. FIG. 2 is a perspective view of a traveling vehicle V used in the traveling vehicle system SYS shown in FIG. 1. FIG. 3 is a side view showing an example of the traveling vehicle V. FIG. 4 is a functional block diagram showing an example of a controller TC and an in-vehicle controller VC.

The traveling vehicle system SYS is a system for transporting articles M by traveling vehicles V in a clean room of a semiconductor manufacturing factory, for example. The traveling vehicle system SYS includes a first traveling vehicle V1 to an nth traveling vehicle Vn (may be collectively referred to as traveling vehicles V) (see FIG. 4), and controllers (controller TC, in-vehicle controller VC) that control the plurality of traveling vehicles V. An example will be described in which the traveling vehicles V are overhead traveling vehicles. The traveling vehicles V travel along a track R of the traveling vehicle system SYS and transport articles M such as FOUPs accommodating semiconductor wafers or reticle pods accommodating reticles. The traveling vehicles V transport articles M, and may hence be referred to as transport vehicles.

The track R is installed on or in the vicinity of the ceiling of a building such as a clean room. The track R is provided above a processing apparatus (not shown), a stocker (automated warehouse, not shown), a buffer (not shown) and so forth. The above processing apparatus is, for example, an exposure apparatus, a coater/developer, a film forming apparatus, or an etching apparatus, and performs various processes on semiconductor wafers in FOUPs transported by the traveling vehicles V. The stocker mentioned above includes a stacker crane or the like not shown in the drawings and stores articles M transported by the traveling vehicles V. The buffer mentioned above is a rack installed in the vicinity of the load port of the processing apparatus, and temporarily stores articles M transported by the traveling vehicles V.

The track R is a grid-patterned track having first tracks R1, second tracks R2, and intersection tracks R3. Hereinafter, the track R will be referred to as grid-patterned track R. The first tracks R1 each extend along the X direction (first direction DR1). The second tracks R2 each extend along the Y direction (second direction DR2). The first direction DR1 and the second direction DR2 are orthogonal to each other, and the plurality of first tracks R1 and the plurality of second tracks R2 are provided along the directions orthogonal to each other but are arranged to not come into contact with each other.

The intersection track R3 is arranged at the intersection of the first track R1 and the second track R2. The intersection track R3 is adjacent to the first track R1 in the first direction DR1, and is adjacent to the second track R2 in the second direction DR2. The intersection track R3 forms the track in the first direction DR1 together with the first track R1 and forms the track in the second direction DR2 together with the second track R2. In the grid-patterned track R, the first tracks R1 and the second tracks R2 are provided in directions orthogonally intersecting with each other, whereby a plurality of squares are arranged longitudinally and laterally (in the first direction DR1 and the second direction DR2) adjacent to each other as seen in a plan view. As will be described later, each square corresponds to a grid cell C (cell). One grid cell C is a portion surrounded, as seen in a plan view, by two first tracks R1 adjacent to each other in the second direction DR2 and by two second tracks R2 adjacent to each other in the first direction DR1. FIG. 1 shows a part of the grid-patterned track R, and the grid-patterned track R is formed such that a configuration similar to that shown in the figure continues in the first direction DR1 (X direction) and in the second direction DR2 (Y direction).

The first tracks R1, the second tracks R2, and the intersection tracks R3 are suspended from the ceiling not shown in the drawings by suspenders H (see FIG. 1). Each suspender H has first portions H1 to suspend the first track R1, second portions H2 to suspend the second track R2, and a third portion H3 to suspend the intersection track R3. The first portion H1 and the second portion H2 are provided at two opposing locations having the third portion H3 therebetween.

The first track R1, the second track R2, and the intersection track R3 have traveling surfaces R1a, R2a, and R3a respectively. Traveling wheels 21 of the traveling vehicle V, which will be described later, roll on the traveling surfaces R1a, R2a, and R3a. A clearance D is formed between the first track R1 and the intersection track R3 and between the second track R2 and the intersection track R3. The clearance D is a portion through which a coupler 30 (described later) serving as a part of the traveling vehicle V passes when the traveling vehicle V having traveled on the first track R1 crosses the second track R2 or when the traveling vehicle V having traveled on the second track R2 crosses the first track R1. Therefore, the clearance D is provided with a width that allows the coupler 30 to pass therethrough. The first tracks R1, the second tracks R2, and the intersection tracks R3 are provided along the same or substantially the same horizontal plane. The first tracks R1, the second tracks R2, and the intersection tracks R3 are such that the traveling surfaces R1a, R2a, and R3a thereof are arranged on the same or substantially the same horizontal plane.

The traveling vehicle system SYS includes a communication system CS. The communication system CS is used for communication between the traveling vehicles V and the controller TC. The traveling vehicles V and the controller TC are communicably connected via the communication system CS.

On the grid-patterned track R, the traveling vehicles V can selectively proceed either in the first direction DR1 or in the second direction DR2. For each grid cell C, a blocking section is designated which undergoes, when occupied by one of a plurality of traveling vehicles V, exclusive control to prohibit another traveling vehicle V from moving thereinto. That is to say, the grid cell C is also an area as a blocking section. The traveling vehicle V a predetermined grid cell C can proceed to a grid cell C adjacent thereto if occupation permission for the adjacent grid cell C has been granted from the controller TC, whereas the traveling vehicle V stops at the predetermined grid cell C and will not proceed to the adjacent grid cell C if occupation permission is not granted. Interference between the traveling vehicles V can be prevented by granting occupation permission for a grid cell C in this manner.

A configuration of the traveling vehicle V will be described. As shown in FIGS. 2 to 4, the traveling vehicle V has a main body 10, travelers 20, couplers 30, and an in-vehicle controller VC. The main body 10 is arranged below the grid-patterned track R (on the −Z side). The main body 10 is formed, for example, in a rectangular shape as seen in a plan view. The main body 10 is formed in a size that fits in a single grid cell C (see FIG. 1) in the grid-patterned track R as seen in a plan view. As a result, when the traveling vehicles V traveling respectively on the first track R1 and the second track R2 adjacent to each other pass one another, the main bodies 10 thereof would not interfere with each other.

The main body 10 includes an upper unit 17 and a transferer 18. The upper unit 17 is suspended from the travelers 20 via the couplers 30. The upper unit 17 is, for example, of a rectangular shape as seen in a plan view, and has four corners on the upper faces 17a. Each of the four corners is coupled with the traveler 20. The four corners are all coupled with the travelers 20, thereby enabling stable suspension of the main body 10 and stable traveling of the main body 10.

The transferer 18 is provided below the upper unit 17. The traveling vehicle V can receive or deliver the article M from or to a predetermined position, using the transferer 18. The transferer 18 has an article holder 13 to hold an article M, a lift driver 14 to raise or lower the article holder 13 in the vertical direction, a lateral extender 11 to move the lift driver 14 in the horizontal direction, and a rotator 12 to rotate the lateral extender 11.

The article holder 13 grasps the flange Ma of an article M to thereby suspend and hold the article M. The article holder 13 is, for example, a chuck having claws 13a movable in the horizontal direction, and inserts the claws 13a under the flange Ma of the article M and raises the article holder 13, to thereby hold the article M. The article holder 13 is connected to suspenders 13b such as wires and belts. The operation of the claws 13a is controlled by the in-vehicle controller VC.

The lift driver 14 is, for example, a hoist, and lowers the article holder 13 by feeding out suspenders 13b and raises the article holder 13 by taking up the suspenders 13b. The lift driver 14 is controlled by the in-vehicle controller VC to raise or lower the article holder 13 at a predetermined speed.

Also, the lift driver 14 is controlled by the in-vehicle controller VC to maintain the article holder 13 at a target height.

The lateral extender 11 has a plurality of movable plates arranged stacked, for example, in the Z direction. The movable plates can move relatively in the Y direction. The lift driver 14 is mounted on the lowermost movable plate. The lateral extender 11 can laterally extend (slide and move) the lift driver 14 and the article holder 13 attached to the lowermost movable plate in a direction, for example, in the horizontal direction orthogonal to the traveling direction of the traveling vehicle V, by moving the movable plates by a driver not shown in the drawings. The operation of the movable plates is controlled by the in-vehicle controller VC.

The rotator 12 is provided between the lateral extender 11 and the upper unit 17. The rotator 12 has a rotation member 12a and a rotation driver 12b. The rotation member 12a is provided to be rotatable in an axial direction around the vertical direction. The rotation member 12a supports the lateral extender 11 on the lower face side. The rotation driver 12b uses, for example, an electric motor or the like, and causes the rotation member 12a to rotate in the axial direction around the rotation axis AX1. The rotator 12, by rotating the rotation member 12a by the driving force from the rotation driver 12b, rotates the lateral extender 11 (lift driver 14 and article holder 13) in the axial direction around the rotation axis AX1. That is to say, the rotator 12 rotates the transferer 18 around the rotation axis AX1.

As shown in FIGS. 2 and 3, a cover W may be provided to surround the transferer 18 and the article M held by the transferer 18. The cover W is of a cylindrical shape having an open-ended bottom, and is of a shape having a cutout portion through which the movable plates of the lateral extender 11 project. The upper end of the cover W is attached to the rotation member 12a of the rotator 12, and the cover W rotates axially around the rotation axis AX1 as the rotating member 12a rotates.

Each traveler 20 has a traveling wheel 21 and auxiliary wheels 22. The traveling wheel 21 is arranged in each of the four corners on the upper face 17a of the upper unit 17 (main body 10). Each traveling wheel 21 is mounted on an axle provided in the coupler 30. The axle is provided in parallel or substantially parallel along the XY plane. Each traveling wheel 21 is driven to rotate by the driving force of a traveling driver 33, which will be described later. Each traveling wheel 21 rolls on the traveling surfaces R1a, R2a, and R3a of the first track R1, the second track R2, and the intersection track R3 of the grid-patterned track R, causing the traveling vehicle V to travel. The configuration is not limited to driving all of the four traveling wheels 21 to rotate by the driving force of the traveling driver 33, and only some of the four traveling wheels 21 may be driven to rotate.

Each traveling wheel 21 is provided to be able to pivot in the θZ direction around the pivoting axis AX2. The auxiliary wheels 22 are each arranged in front and rear of the traveling wheel 21 in the traveling direction. As with the traveling wheel 21, each auxiliary wheel 22 can rotate around the axis of the axle, which is parallel or substantially parallel along the XY plane. The lower end of the auxiliary wheel 22 is set higher than the lower end of the traveling wheel 21. Therefore, when the traveling wheel 21 is traveling on the traveling surfaces R1a, R2a, and R3a, the auxiliary wheels 22 do not come into contact with the traveling surfaces R1a, R2a, and R3a. When the traveling wheel 21 passes through the clearance D (see FIG. 1), the auxiliary wheels 22 come into contact with the traveling surfaces R1a, R2a, and R3a, preventing the traveling wheel 21 from falling. The configuration is not limited to providing two auxiliary wheels 22 for a single traveling wheel 21 and, for example, a single auxiliary wheel 22 may be provided for a single traveling wheel 21, or no auxiliary wheel 22 may be provided.

As shown in FIG. 2, the couplers 30 connect the upper unit 17 of the main body 10 and the travelers 20. The coupler 30 is provided at each of the four corners on the upper face 17a of the upper unit 17 (main body 10). The main body 10 is suspended from the travelers 20 by the couplers 30 and is arranged below the grid-patterned track R. The coupler 30 has a support member 31 and a connection member 32. The support member 31 rotatably supports the rotation shaft of the traveling wheel 21 and the rotation shafts of the auxiliary wheels 22. The support member 31 maintains the relative position between the traveling wheel 21 and the auxiliary wheels 22. The support member 31 is formed, for example, in a plate shape with a thickness that allows it to pass through the clearance D (see FIG. 1).

The connection members 32 each extend downward from the support member 31 and is coupled to the upper surface 17a of the upper unit 17 to hold the upper unit 17. The connection member 32 therein includes a transmission for transmitting the driving force of the traveling driver 33 described later to the traveling wheel 21. This transmission may be of a configuration in which a chain or a belt is used, or a configuration in which a gear train is used. The connection member 32 is provided to be able to pivot in the OZ direction around the pivoting axis AX2. The pivoting of the connection member 32 around the pivoting axis AX2 can cause the traveling wheel 21 to pivot around the pivoting axis AX2 in the OZ direction via the support member 31.

The coupler 30 includes the traveling driver 33 and the direction changer 34. The traveling driver 33 is mounted on the connection member 32. The traveling driver 33 is a drive source to drive the traveling wheel 21 and, for example, an electric motor or the like is used therefor. Each of the four traveling wheels 21 is driven by the traveling driver 33 to serve as a driving wheel. The four traveling wheels 21 are controlled by the in-vehicle controller VC to rotate at the same or substantially the same rotation speed. If any one of the four traveling wheels 21 is not used as a driving wheel, the traveling driver 33 is not attached to the connection member 32 thereof.

The direction changer 34 causes the connection member 32 of the coupler 30 to pivot around the pivoting axis AX2 to thereby cause the traveling wheel 21 to pivot around the pivoting axis AX2 in the OZ direction. It is possible, by turning the traveling wheel 21 in the OZ direction, to switch from a first state where the traveling direction of the traveling vehicle V is the first direction DR1 to a second state where the traveling direction is the second direction DR2, or from the second state where the traveling direction is the second direction DR2 to the first state where the traveling direction is the first direction DR1.

The direction changer 34 has a drive source 35, a pinion gear 36, and a rack 37. The drive source 35 is mounted on a side face of the traveling driver 33 away from the pivoting axis AX2. As the drive source 35, for example, an electric motor or the like is used. The pinion gear 36 is mounted on the lower surface side of the drive source 35, and is driven to rotate in the OZ direction by the driving force generated by the drive source 35. The pinion gear 36 is of a circular shape as seen in a plan view and has a plurality of teeth on the outer circumference thereof along the circumferential direction. The rack 37 is fixed to the upper face 17a of the upper unit 17. The rack 37 is provided at each of the four corners on the upper face 17a of the upper unit 17, and is provided having an arc shape (sectorial shape) centered on the pivoting axis AX2 of the traveling wheel 21. The rack 37 has a plurality of teeth which mesh with the teeth of the pinion gear 36, on the outer circumference thereof along the circumferential direction.

The pinion gear 36 and the rack 37 are arranged in the state where the teeth of the pinion gear 36 and the teeth of the rack 37 are in mesh with each other. As the pinion gear 36 rotates in the OZ direction, the pinion gear 36 moves in the circumferential direction around the pivoting axis AX2 along the outer circumference of the rack 37. As a result of this movement of the pinion gear 36, the connection member 32 pivots, and the traveling driver 33 and the direction changer 34 pivot together with the pinion gear 36 in the circumferential direction and around the pivoting axis AX2.

As a result of the pivoting of the direction changer 34, the traveling wheel 21 and the auxiliary wheels 22 arranged in each of the four corners on the upper face 17a all pivot in the OZ direction around the pivoting axis AX2 within a range of 90 degrees. The driving of the direction changer 34 is controlled by the in-vehicle controller VC. The in-vehicle controller VC may cause the four traveling wheels 21 to pivot at the same timing, or may cause them to pivot at different timings. By causing the traveling wheel 21 and the auxiliary wheels 22 to pivot, the traveling wheel 21 shifts from the state of being in contact with one of the first track R1 and the second track R2 to the state of being in contact with the other. In other words, the traveling wheel 21 shifts from the state where the direction of the rotation axis of the traveling wheel 21 is one of the first direction DR1 and the second direction DR2 to the state where direction of the rotation axis of the traveling wheel 21 is the other. As a result, it is possible to switch between the first state where the traveling direction of the traveling vehicle V is the first direction DR1 (X direction) and the second state where the traveling direction is the second direction DR2 (Y direction).

The traveling vehicle V includes a position detector (not shown in the drawings) that detects position information of the traveling vehicle of its own. The position detector detects the current position of the traveling vehicle of its own by detecting a position marker (not shown) indicating position information. The position detector detects the position marker in a noncontact manner. The position marker is installed, for example, at each grid cell C (each area) of the grid-patterned track R.

The in-vehicle controller VC comprehensively controls the traveling vehicle V. As shown in FIG. 4, the in-vehicle controller VC includes a memory storage 51 that memorizes (stores) various types of data, a communicator 52, a traveling controller 53, a transfer controller 54, a state information processor 55, and an occupation permission requester 56. The in-vehicle controller VC is, for example, a computer device. While this is an example of the in-vehicle controller VC as provided on the upper unit 17, the in-vehicle controller VC may be provided on the cover W or outside the main body 10.

The communicator 52 wirelessly communicates with the controller TC and other devices (external devices). The traveling controller 53 controls traveling of the traveling vehicle V by controlling the traveling driver 33 and the direction changer 34. The traveling controller 53 controls, for example, operations related to traveling (traveling speed) and stopping, and operations related to direction changing. The traveling controller 53 controls traveling on the basis of a traveling instruction CM described later. The transfer controller 54 controls the transferer 18 to thereby control transfer operations. The transfer controller 54 controls the pickup operation to grip and hold an article M arranged at a predetermined location and the unloading operation to unload and release the held article M to a predetermined location.

The state information processor 55 periodically generates and updates state information A. The state information A is stored in the memory storage 51. The state information processor 55 transmits the state information A to the controller HC via the communicator 52. The state information A include, for example, information on the current position of the traveling vehicle of its own, information indicating the current moving speed, information indicating the presence or absence of a load, and information on the execution state (being executed, execution completed, execution failed) of various instructions such as a traveling instruction CM.

When the traveling vehicle V travels on the grid-patterned track R according to the traveling instruction CM, the occupation permission requester 56 generates an occupation permission request for proceeding from the current grid cell (predetermined grid cell) C to a grid cell C adjacent thereto in the traveling direction designated in the traveling instruction CM. The occupation permission requester 56 may generate an occupation permission request for a grid cell C adjacent to the current grid cell C in the traveling direction on a one-by-one basis, or generate a plurality of occupation permission requests for a plurality of grid cells C from the current grid cell C in the traveling direction. The occupation permission request generated by the occupation permission requester 56 is transmitted to the controller TC via the communicator 52. An occupation permission request may be included in state information A and transmitted, or may be transmitted separately from state information A.

The controller TC transmits various instructions to the traveling vehicle V to thereby control the traveling vehicle V. The controller TC includes a memory storage 61 that memorizes (stores) various types of data, a communicator 62, a traveling instruction generator 63, an assignor 64, the state information requester 65, an occupation permission determiner 66, a determiner 67, and a timer 68. The controller TC is a computer device that includes, for example, a CPU, a main memory, a memory storage device, a communication device and so forth and processes various types of information. The controller TC, for example, processes various information (data), stores information, inputs and/or outputs information, and performs communication (transmitting and/or receiving). The controller TC stores in the memory storage 61 information or a control program required for controlling each traveling vehicle V. The configuration of the controller TC shown in FIG. 4 is merely an example, and other configurations may be employed.

The communicator 62 wirelessly communicates with the in-vehicle controller VC and other devices (external devices). The traveling instruction generator 63 generates traveling instructions CM. A traveling instruction CM is an instruction to cause a traveling vehicle V to travel along a predetermined route. A traveling instruction CM may be an instruction that includes a traveling route of a traveling vehicle V, or an instruction that does not include a traveling route of a traveling vehicle V but designates a destination. When a traveling instruction CM does not include a traveling route, the in-vehicle controller VC of the traveling vehicle V generates a traveling route to a destination designated in the traveling instruction CM. The assignor 64 assigns to the traveling vehicle V a traveling instruction CM generated by the traveling instruction generator 63. The state information requester 65 transmits a state information request instruction RQ that requests the traveling vehicle V to transmit state information A.

The occupation permission determiner 66 accepts the occupation permission request transmitted from the in-vehicle controller VC, and determines whether or not to grant occupation permission for the grid cell C, which is the target of the occupation permission, to the traveling vehicle V that has issued the occupation permission request. If occupation permission for the grid cell C has already been transmitted to another traveling vehicle V (if the grid cell C is occupied by any traveling vehicle V), the occupation permission determiner 66 does not grant occupation permission until the another traveling vehicle V has been confirmed to have proceeded to another grid cell C (until occupation of the grid cell C has been released). When granting occupation permission for a grid cell C, the occupation permission determiner 66 generates information related to occupation permission, and transmits it via the communicator 62 to the traveling vehicle V that has transmitted the occupation permission request.

The controller TC includes the occupation permission determiner 66. However, this disclosure is not limited to this example. For example, the occupation permission determiner 66 may be provided in a controller (for example, a blocking controller) separately from the controller TC.

The determiner 67 performs various types of determinations on the basis of state information A provided from a traveling vehicle V. For example, the determiner 67 determines whether or not a traveling vehicle V has continuously been in a stop state at a predetermined grid cell C for a predetermined period of time. In other words, the point in time at which the traveling vehicle V stops is taken as a start time point to determine whether or not a predetermined period of time has elapsed with the traveling vehicle V being in a stop state. In such a configuration, the determiner 67 detects whether or not the current moving speed in the state information A is zero, and determines the traveling vehicle V as being in a stop state if the moving speed is zero (or substantially zero). If the traveling vehicle V is determined as being in a stop state, the determiner 67 measures the stop time duration using the timer 68, and stops measuring it when the traveling vehicle V is no longer in the stop state (when the moving speed is no longer zero), but continues to measure it as long as the traveling vehicle V continues to be in the stop state. Then, the determiner 67 determines whether or not the stop time duration measured by the timer 68 has reached a predetermined threshold value. If the stop time duration is determined as having reached the predetermined threshold value, the determiner 67 determines the traveling vehicle V as having continuously been in a stop state for a predetermined period of time.

If the determiner 67 determines the traveling vehicle V as having continuously been in a stop state for a predetermined period of time, the traveling instruction generator 63 generates a new traveling instruction CM in which a grid cell C in a different direction (second direction DR2) situated at a plurality of cells C (a plurality of squares) ahead of the grid cell (predetermined grid cell) C where the traveling vehicle V has been in the stop state is designated as a waypoint for traveling to the destination, replacing the direction (first direction DR1) in which the traveling vehicle V is to proceed according to the previous traveling instruction CM. The assignor 64 assigns the new traveling instruction CM generated by the traveling instruction generator 63 to the traveling vehicle V that has continuously been in a stop state for a predetermined period of time.

The determiner 67 determines whether or not the traveling vehicle V with the new traveling instruction CM having been assigned thereto has reached or approached the waypoint instructed by the traveling instruction CM. For example, the determiner 67 detects the grid cell C of the current position of the traveling vehicle V in the state information A, and calculates the distance between the current grid cell C and the grid cell C of the waypoint (or the number of grid cells C arranged therebetween). The determiner 67 determines the traveling vehicle V as having reached the waypoint if the calculation result is 0, or determines the traveling vehicle V as having approached the waypoint if the calculation result is less than or equal to a predetermined threshold value.

Moreover, the determiner 67 may determine whether or not any section through which procession is not possible is present on the traveling route of the new traveling instruction CM. If the determiner 67 determines a section through which procession is not possible as being present on the traveling route of the new traveling instruction CM, the traveling instruction generator 63 may generate a new traveling instruction CM that designates a grid cell C just short of that section, through which procession is not possible, as a waypoint. The assignor 64 assigns the new traveling instruction CM generated by the traveling instruction generator 63 to the traveling vehicle V that has continuously been in the stop state for the predetermined period of time.

Figure 5:
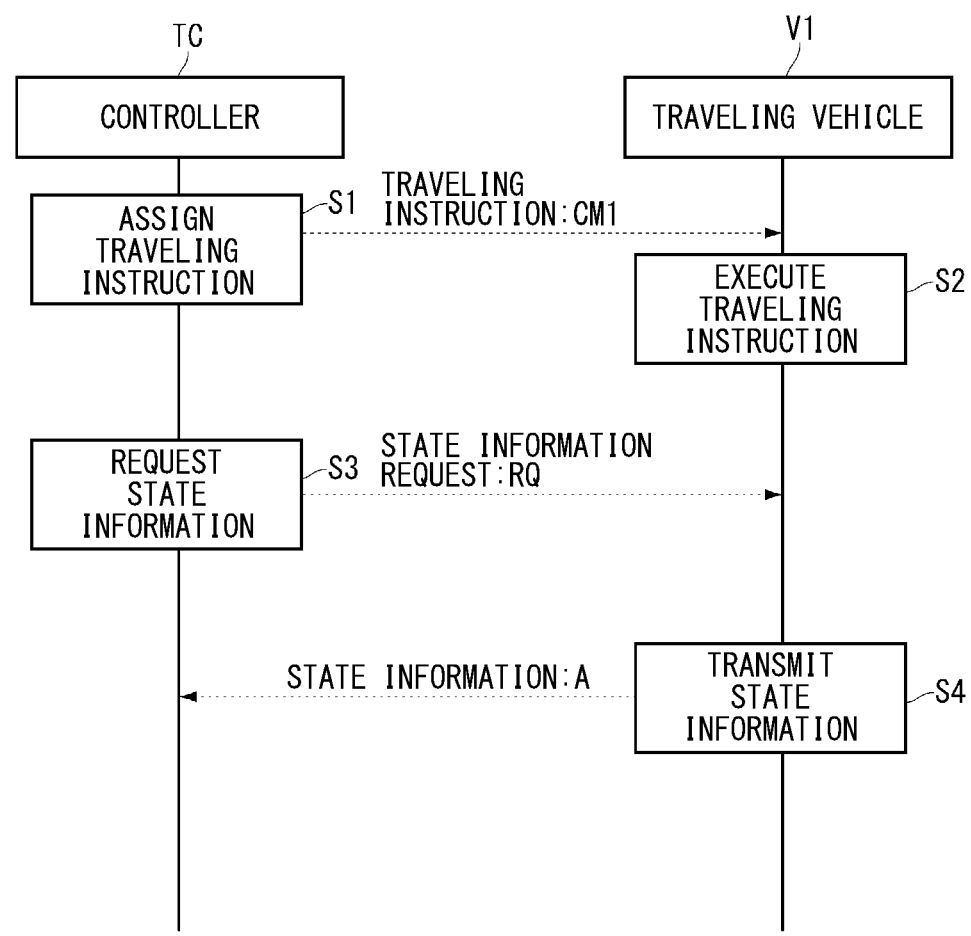
FIG. 5 is a diagram showing an example of an operation sequence of the traveling vehicle system.
Figure 6:
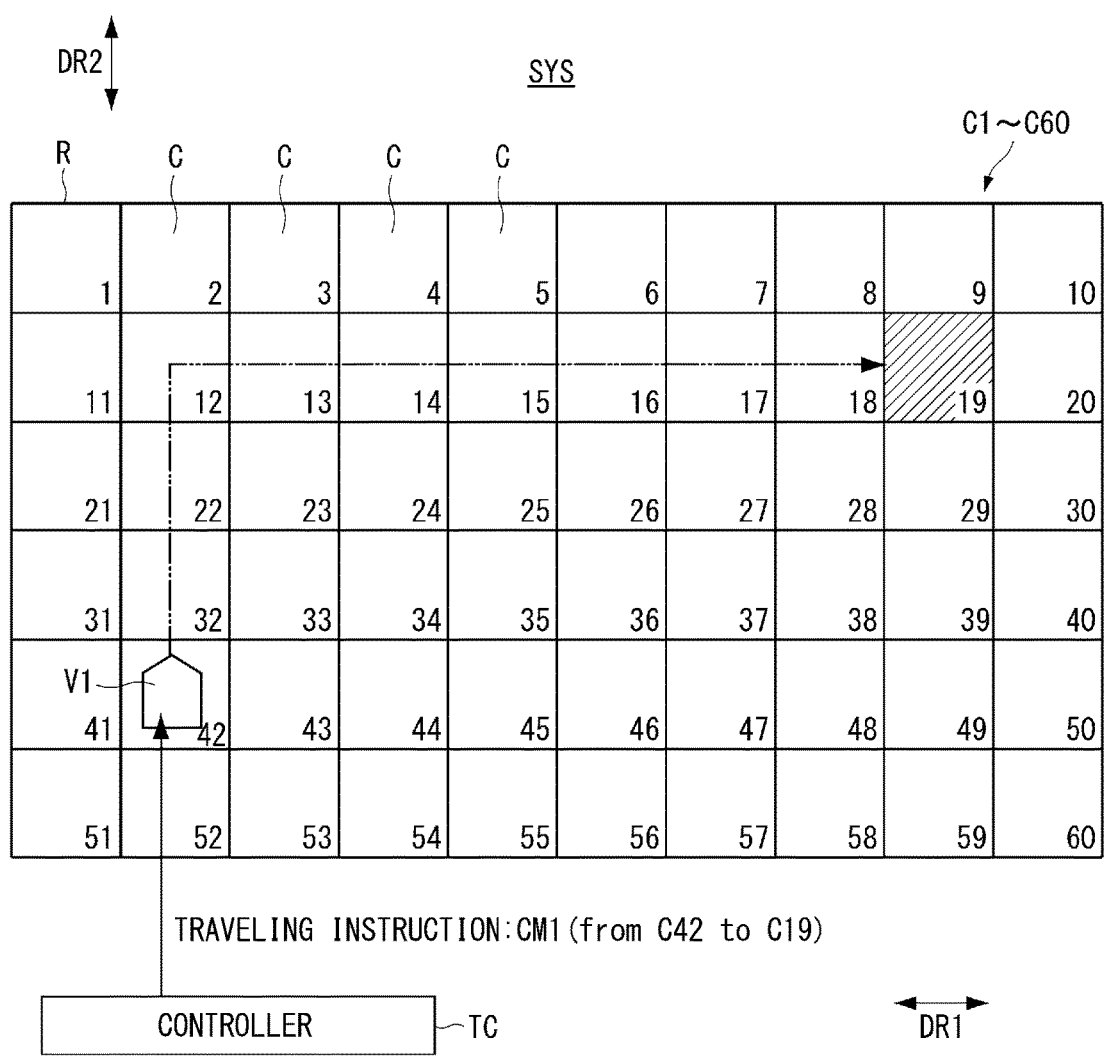
FIG. 6 is a diagram showing an example of an operation of the traveling vehicle in the traveling vehicle system.

Next, the operation of the traveling vehicle system SYS will be described. FIG. 5 is a diagram showing an example of an operation sequence of the traveling vehicle system SYS. FIG. 6 is a diagram showing an example of the operations of the traveling vehicles V in the traveling vehicle system SYS. Only a part of the grid-patterned track R is illustrated in FIG. 6 and also in FIGS. 8 to 10, which will be described later. Also, in FIG. 6 and in FIGS. 8 to 10, the digits used in the reference signs "1 to 60" or "1 to 120" respectively indicate grid cells C1 to C60 or grid cells C1 to C120.

The traveling instruction generator 63 of the controller TC generates a traveling instruction CM1. As shown in FIG. 6, a traveling instruction CM1 is an instruction that instructs to proceed along, for example, the traveling route denoted by the two-dot chain line from the grid cell C42 to the grid cell C19. This traveling instruction CM1 may be a transport instruction for transporting an article M placed at a position corresponding to the grid cell C42 to the grid cell C19.

As shown in FIG. 5, the assignor 64 assigns to the traveling vehicle V the generated traveling instruction CM1 (Step S1). In Step S1, the assignor 64 selects, for example, a traveling vehicle V1 able to transport an article M, from a plurality of traveling vehicles V, and assigns the traveling instruction CM1 to the selected traveling vehicle V1. The controller TC has state information of each traveling vehicle V, map information showing the location of each part (such as processing apparatus, storage apparatus, or buffer) related to the traveling vehicle system SYS, position information of an article M and so forth (this information is referred to as system information). The assignor 64 assigns the traveling instruction CM1 to the traveling vehicle V1 able to transport an article M, on the basis of these information. The controller TC updates system information by periodically communicating with the traveling vehicles V1 to Vn.

Upon the traveling vehicle V1 receiving the traveling instruction CM1, the traveling controller 53 of the in-vehicle controller VC controls traveling of the traveling vehicle V1 on the basis of the traveling instruction CM1, and the traveling instruction CM1 is executed (Step S2). In Step S2, when the traveling vehicle V1 travels on the grid-patterned track R, as described above, the occupation permission requester 56 (see FIG. 4) transmits to the controller TC an occupation permission request regarding the next grid cell C (adjacent grid cell C, that is, grid cell C32 in FIG. 6) in the traveling direction of the grid cell C42 (predetermined grid cell C). The controller TC determines, by the occupation permission determiner 66 (see FIG. 4), whether or not proceeding to the grid cell C32 of the occupation permission request target is possible, and if this procession is possible, the controller TC transmits occupation permission for the grid cell C32 to the traveling vehicle V1.

Upon obtaining the occupation permission, the traveling vehicle V1 proceeds to the grid cell C32. Such occupation permission request and acquisition of occupation permission are repeated in turns for the following grid cells C, and thereby the traveling vehicle V1 proceeds along the route designated by the traveling instruction CM1. In the example described above, the traveling vehicle V1 issues an occupation permission request for an adjacent grid cell C in the traveling direction on a one-by-one basis. However, this disclosure is not limited to this example. For example, the traveling vehicle V1 may collectively issue a plurality of occupation permission requests for a plurality of grid cells C32, C22, and C12 up to the grid cell C12 in the traveling direction where a direction change is to be performed. In such a configuration, the occupation permission determiner 66 of the controller TC may determine whether or not to grant occupation permission for each of the plurality of occupation permission requests, and collectively transmit a plurality of occupation permissions to the traveling vehicle V1.

The controller TC, by the state information requester 65, transmits a state information request instruction RQ to the traveling vehicle V1 (Step S3). The controller TC periodically requests state information A regardless of whether or not the traveling vehicle V is executing a traveling instruction CM. Having received the state information request instruction RQ, the state information processor 55 (see FIG. 4) of the in-vehicle controller VC transmits state information A to the controller TC on the basis of the state information request instruction RQ (Step S4). The state information A from the traveling vehicle V1 enables the controller TC to grasp the current state of the traveling vehicle V1.

Figure 7:
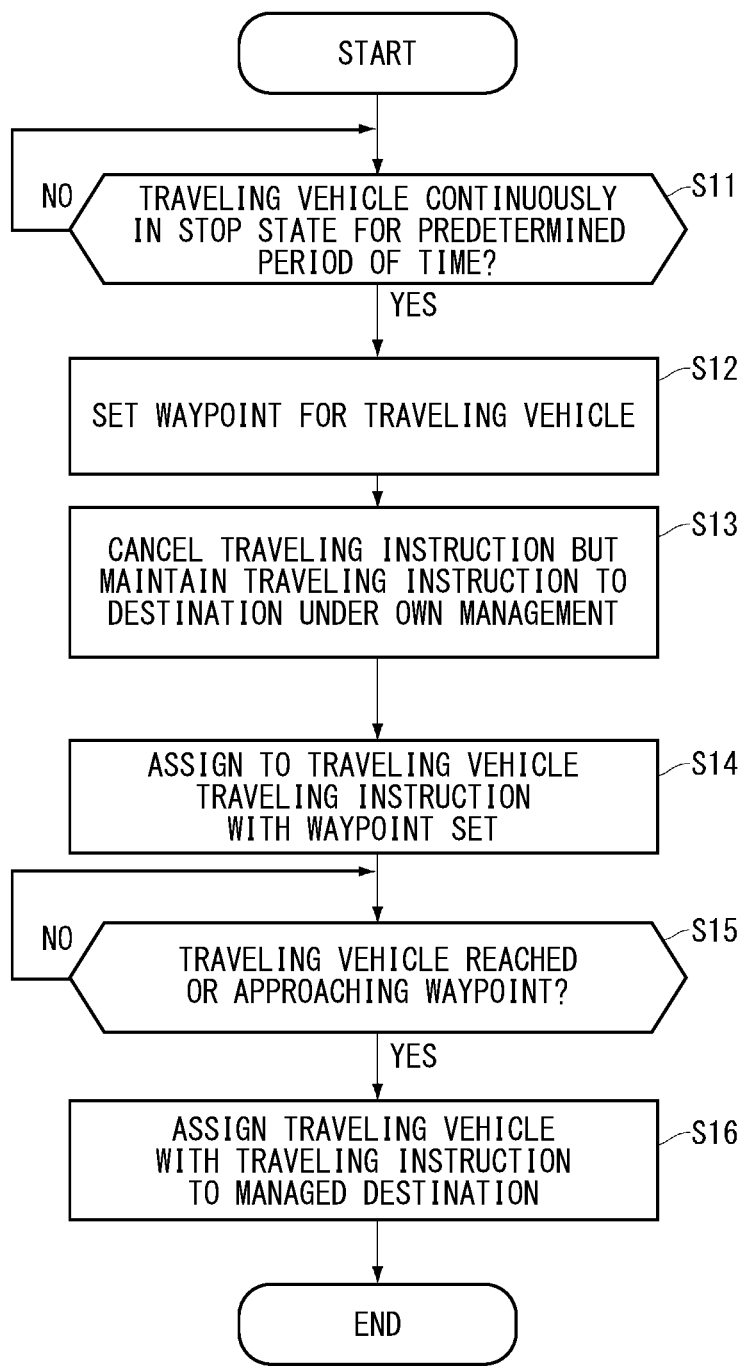
FIG. 7 is a flowchart showing an example of a traveling vehicle control method.
Figure 8:
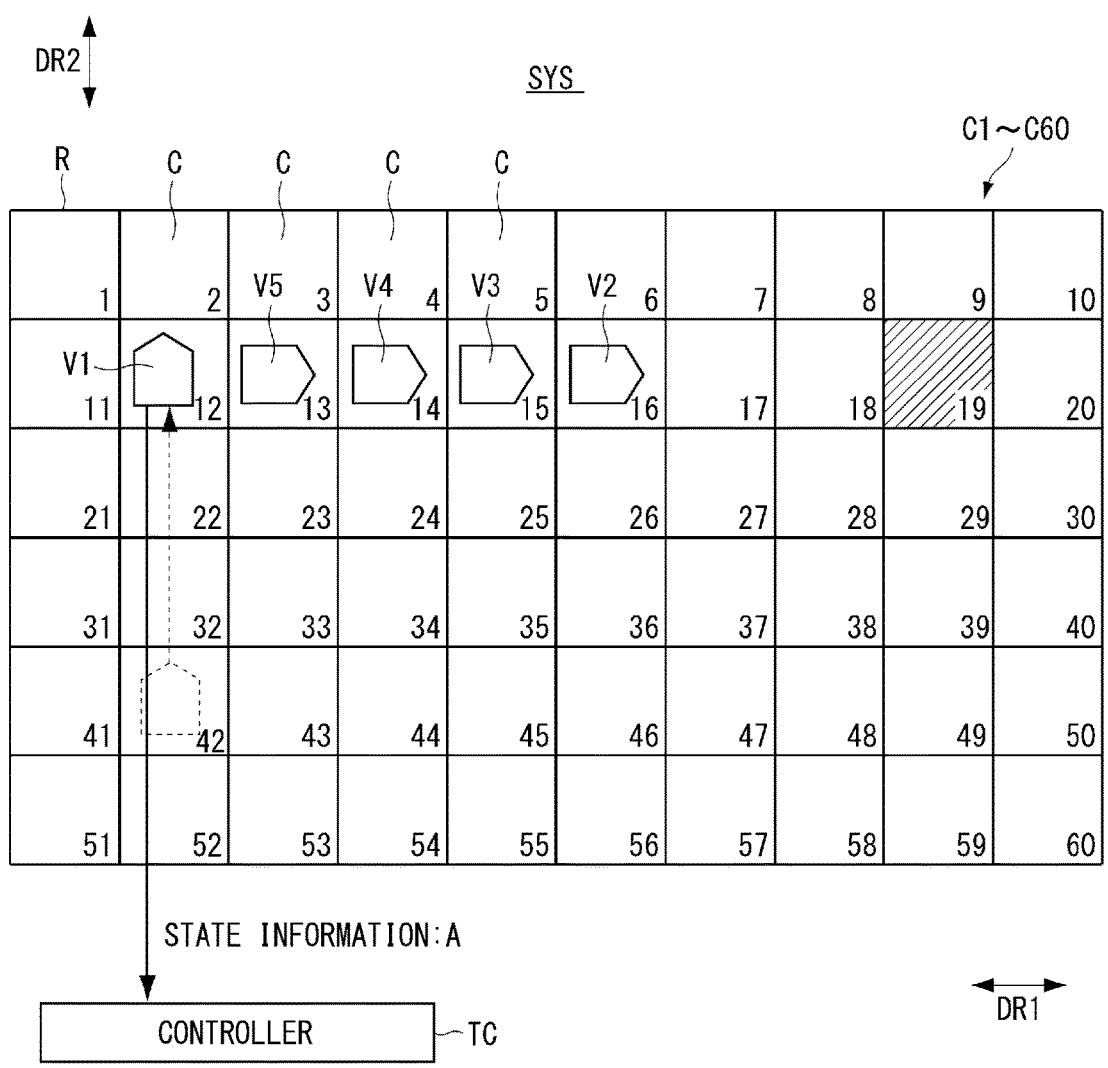
FIG. 8 is a diagram, which follows FIG. 7, and shows an example of operations of the traveling vehicles in the traveling vehicle system.
Figure 9:
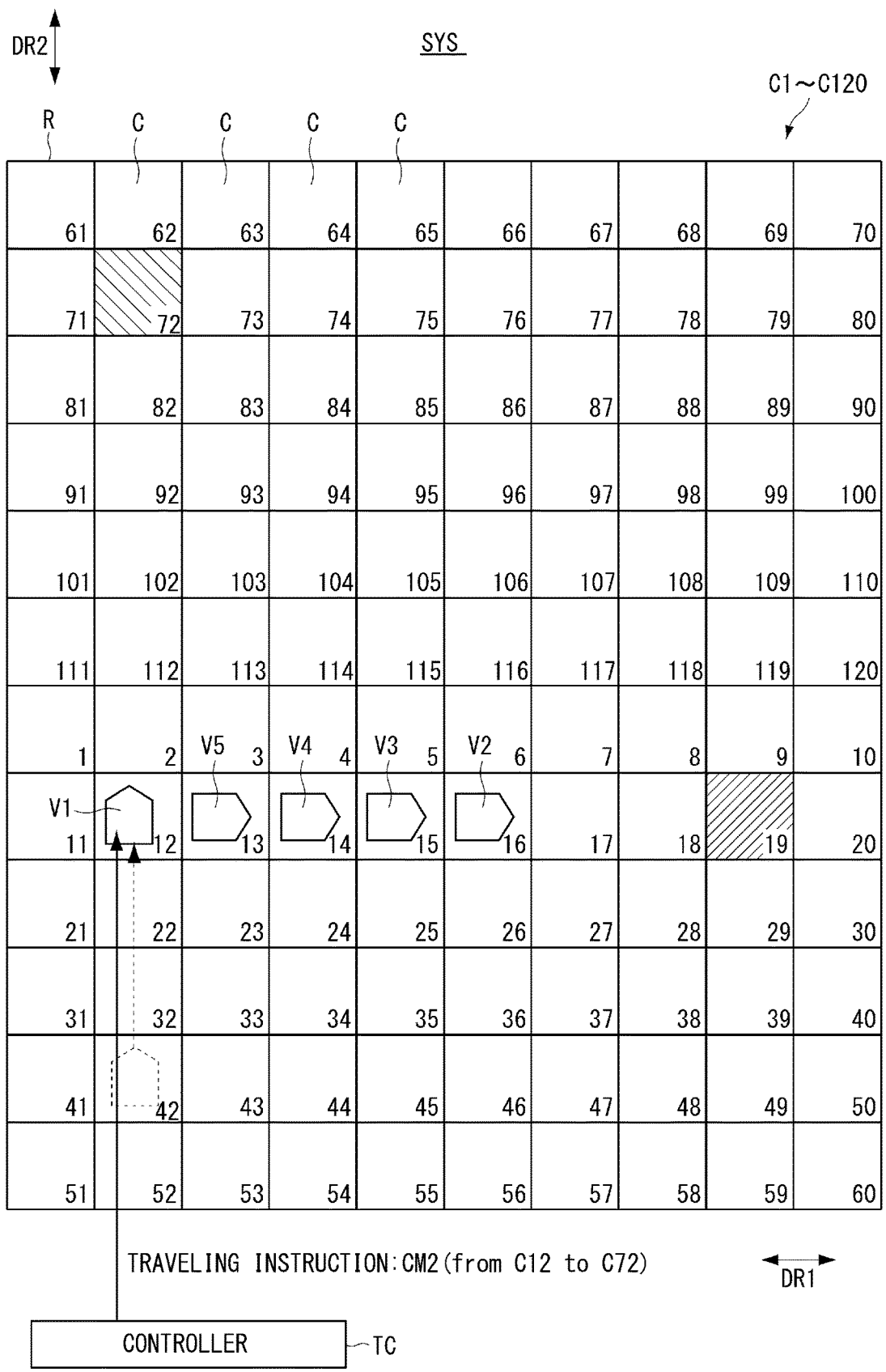
FIG. 9 is a diagram, which follows FIG. 8, and shows an example of operations of the traveling vehicles in the traveling vehicle system.
Figure 10:
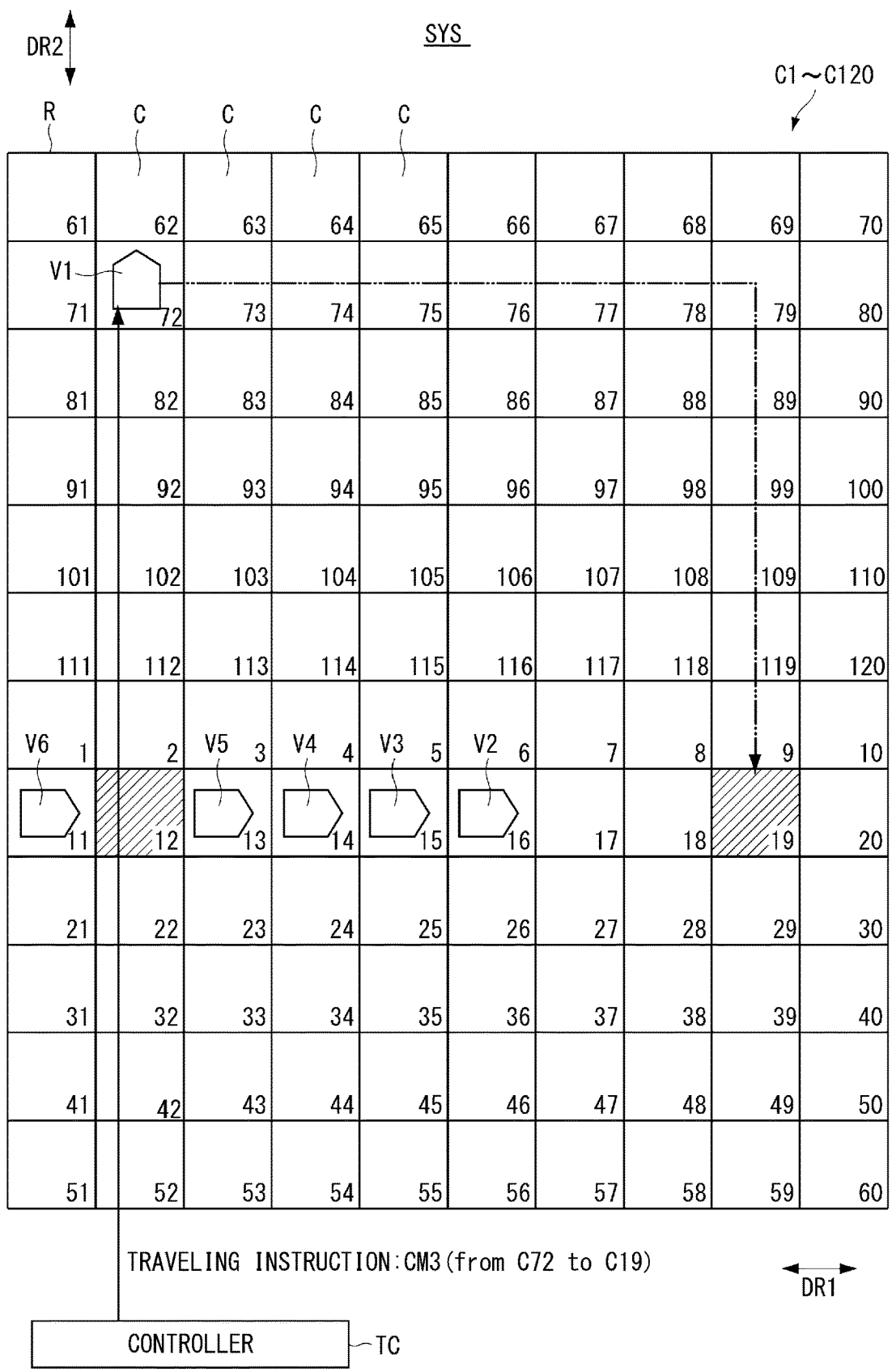
FIG. 10 is a diagram, which follows FIG. 9, and shows an example of operations of the traveling vehicles in the traveling vehicle system.

FIG. 7 is a flowchart showing an example of a traveling vehicle control method. FIG. 7 shows a control flow of the controller TC after the traveling instruction CM1 has been assigned to the traveling vehicle V1. FIGS. 8 to 10 are diagrams showing an example of the operation of the traveling vehicle system SYS. In the example shown in FIG. 8, the traveling vehicle V1 has proceeded from the grid cell C42 in the second direction DR2 according to the traveling instruction CM1 and has arrived at the grid cell (area) C12, and at the grid cell C12, the traveling vehicle V1 is about to proceed in the traveling direction, that is, the first direction DR1.

As shown in FIG. 8, in the first direction DR1 from the grid cell C12 toward the grid cell C19, there are other traveling vehicles V2 to V5 in a stop state at the grid cell C13 to the grid cell C16. These traveling vehicles V2 to V5 are all in a stop state as they are executing operations to transfer articles M, for example. In such a configuration, the grid cells C13 to C16 are occupied by the traveling vehicles V2 to V5, and therefore, exclusive control is performed so that the other traveling vehicles V do not proceed thereto. That is to say, the traveling vehicle V1 stops at the grid cell C12 because occupation permission for the grid cell C13 cannot be obtained.

In Step S3 of FIG. 5 described above, the controller TC, by the state information requester 65, transmits a state information request instruction RQ to the traveling vehicle V1. In Step S4 of FIG. 5, the traveling vehicle V1, by the state information processor 55, transmits state information A to the controller TC. From the received status information A, the controller TC acquires the states of the traveling vehicle V1 such as the execution state of the traveling instruction CM1 as being executed, the current location thereof as being at the grid cell C12, and the traveling state thereof as currently being in a stop state (speed is 0).

As shown in FIG. 7, the determiner 67 of the controller TC (see FIG. 4) determines whether or not the traveling vehicle V1 has continuously been in a stop state for a predetermined period of time (Step S11). In Step S11, if the current state of the traveling vehicle V1 in the state information A is recognized as being in a stop state, the determiner 67 measures the stop time duration of the traveling vehicle V1 by the timer 68. If the measurement result of the timer 68 exceeds a preliminarily set threshold value, the determiner 67 determines the traveling vehicle V1 as having continuously been in a stop state for a predetermined period of time.

If the traveling vehicle V1 is determined as not having continuously been in a stop state for a predetermined period of time after stopping at the grid cell C12 (NO in Step S11), the determiner 67 repeats the determination of Step S11. On the other hand, if the traveling vehicle V1 is determined as having continuously been in a stop state for a predetermined period of time after stopping at the grid cell C12 (YES in Step S11), the traveling instruction generator 63 sets the grid cell C of a waypoint, which is the destination of the traveling vehicle V1 (Step S12). A waypoint is, for example, a temporary destination for traveling to the destination designated by the traveling instruction CM1. In Step S12, the traveling instruction generator 63 sets the grid cell C in the second direction DR2 situated at a plurality of cells (a plurality of squares) ahead of the grid cell C12, where the traveling vehicle V1 has been in the stop state, as a waypoint for the traveling vehicle V1. The traveling instruction generator 63 sets the grid cell C situated at a first predetermined number, which is preliminarily set, of cells ahead of the grid cell C12 as a waypoint for the traveling vehicle V1. An example is shown in which the first predetermined number is 6. Therefore, as shown in FIG. 9, the traveling instruction generator 63 sets the grid cell C72 in the second direction DR2 situated at 6 cells (6 squares) ahead of the grid cell C12 as a waypoint for the traveling vehicle V1.

After having set the waypoint, the traveling instruction generator 63 cancels the traveling instruction CM1 to the destination that has been assigned to the traveling vehicle V1 while still maintaining the traveling instruction CM1 under management of its own (or of the controller TC) (Step S13). When canceling the original traveling instruction CM1, the traveling instruction generator 63 (or controller TC) stores the traveling instruction CM1 (or the grid cell C19 serving as the destination in the traveling instruction CM1) in the memory storage 61 or the like, to thereby maintain the traveling instruction CM1 to the destination under management of its own (or of the controller TC). Then, as shown in FIG. 9, the assignor 64 assigns to the traveling vehicle V1 a traveling instruction CM2 that designates the grid cell C72 set in Step S12 as a waypoint (Step S14). Upon the traveling vehicle V1 receiving the traveling instruction CM2, the traveling controller 53 of the in-vehicle controller VC controls traveling of the traveling vehicle V1 on the basis of the traveling instruction CM2. The traveling vehicle V1 starts to proceed in the second direction DR2 toward the grid cell C72.

When the traveling vehicle V1 is traveling, the traveling vehicle V1 repeatedly performs operations such as requesting occupation permission for the next grid cell C2 in the second direction DR2 and proceeding to the grid cell C2 if occupation permission is obtained, to thereby proceed toward the grid cell C72 in the second direction DR2. As the traveling vehicle V1 proceeds from the grid cell C12 to the grid cell C2, the occupied state of the grid cell C12 is resolved. As a result, as shown in FIG. 10, for example, another traveling vehicle V6 can now proceed from the grid cell C11 to the grid cell C12.

As described above, by causing the traveling vehicle V1 to proceed from the grid cell C12, it is possible to prevent congestion of traveling vehicles V caused by the traveling vehicle V1 being in a stop state. That is to say, if the traveling vehicle V1 becomes unable to proceed, by causing it to proceed to a cell situated at a plurality of cells ahead in a direction different from the traveling direction on the basis of the traveling instruction CM1, it is possible to distribute a plurality of traveling vehicles V on the grid-patterned track R and resolve excessive congestion of a plurality of traveling vehicles V. Also, since the occupation at the grid cell C12 is resolved, another traveling vehicle V6 can now proceed to the grid cell C12, and the operation to transfer an article M can be executed with no delay. As a result, it is possible to prevent reduction in the efficiency of transporting articles M.

The controller TC, by the state information requester 65, transmits a state information request instruction RQ to the traveling vehicle V1. Upon receiving the state information request instruction RQ, the traveling vehicle V1, by the state information processor 55 of the in-vehicle controller VC, transmits state information A to the controller TC. As shown in FIG. 7, the determiner 67 of the controller TC determines whether or not the traveling vehicle V1 has reached or approached the grid cell C72, which is a waypoint, on the basis of the state information A from the traveling vehicle V1 (Step S15). In Step S15, the determiner 67 detects the current location of the traveling vehicle V1 in the state information A and calculates the number of grid cells C up to the grid cell C72, which is a waypoint. If the calculated number is 0, the determiner 67 determines the traveling vehicle V1 as having reached the grid cell C72, or if the calculated number is less than or equal to a preliminarily set predetermined number (for example, 2), it determines the traveling vehicle V1 as having approached the grid cell C72.

If the traveling vehicle V1 is determined as not having reached or approached the grid cell C72 (NO in Step S15), the determiner 67 repeats the determination of Step S15. On the other hand, as shown in FIG. 10, if the traveling vehicle V1 is determined as having reached or approached the grid cell C72 (YES in Step S15), the traveling instruction generator 63 generates a traveling instruction CM3 from the grid cell C72 to the grid cell C19, which has been stored as a destination in Step S13. As shown in FIG. 10, the traveling instruction CM3 is an instruction that instructs to proceed along, for example, the traveling route denoted by the two-dot chain line from the grid cell C72, which is a waypoint, to the grid cell C19.

As described above, by maintaining the destination of the canceled traveling instruction CM1 under the management of the traveling instruction generator 63 (or controller TC), the destination can be easily set in the traveling instruction CM3. The assignor 64 assigns to the traveling vehicle V1 the generated traveling instruction CM3 (Step S16). Upon the traveling vehicle V1 receiving the traveling instruction CM3, the traveling controller 53 of the in-vehicle controller VC controls traveling of the traveling vehicle V1 on the basis of the traveling instruction CM3. After having proceeded in the first direction DR1 from the grid cell C72 and reached the grid cell C79, the traveling vehicle V1 changes its traveling direction to the second direction DR2 at the grid cell C79 and then proceeds, and thereby the traveling vehicle V1 arrives at the grid cell C19, which is the original destination of the traveling vehicle V1. As described above, also in proceeding from the grid cell C72 to the grid cell C19, when proceeding from the current grid cell C (predetermined grid cell C) to the next grid cell C (adjacent grid cell C), the traveling vehicle V1 transmits an occupation permission request to the controller TC. Then, if occupation permission is obtained from the controller TC, the traveling vehicle V1 proceeds to the next grid cell C, whereas it stops at the current grid cell C if occupation permission is not obtained.

As described above, when a traveling vehicle V traveling in the first direction DR1 has continuously been in a stop state at a grid cell C, the controller TC assigns to the traveling vehicle V a traveling instruction that designates a grid cell C in the second direction DR2 situated at a plurality of cells (a plurality of squares) ahead of that grid cell C as a waypoint, and it is therefore possible to prevent the traveling vehicle V from stopping at one grid cell C continuously for a predetermined period of time or longer, and suppress a deadlock from occurring by mitigating congestion of traveling vehicles V.

Figure 11:
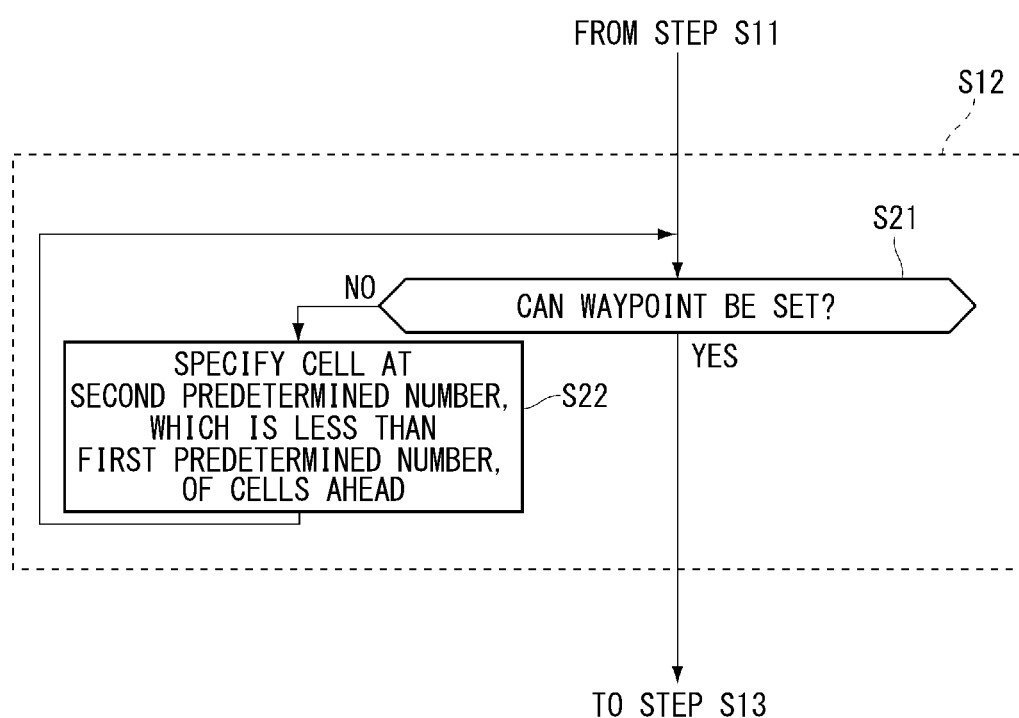
FIG. 11 is a flowchart showing another example of the traveling vehicle control method.
Figure 12:
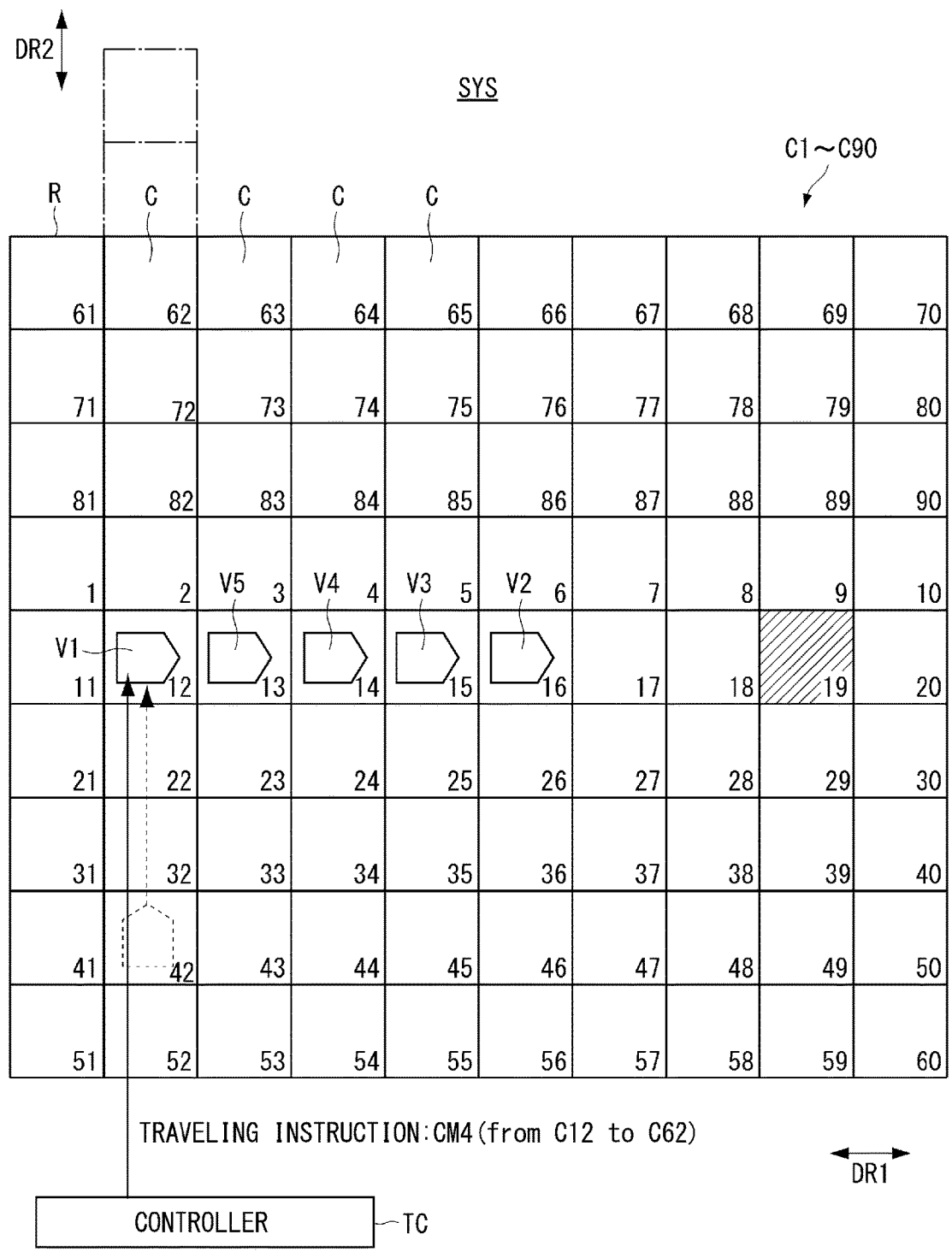
FIG. 12 is a diagram showing an example of operations of the traveling vehicles in the traveling vehicle system.
Figure 13:
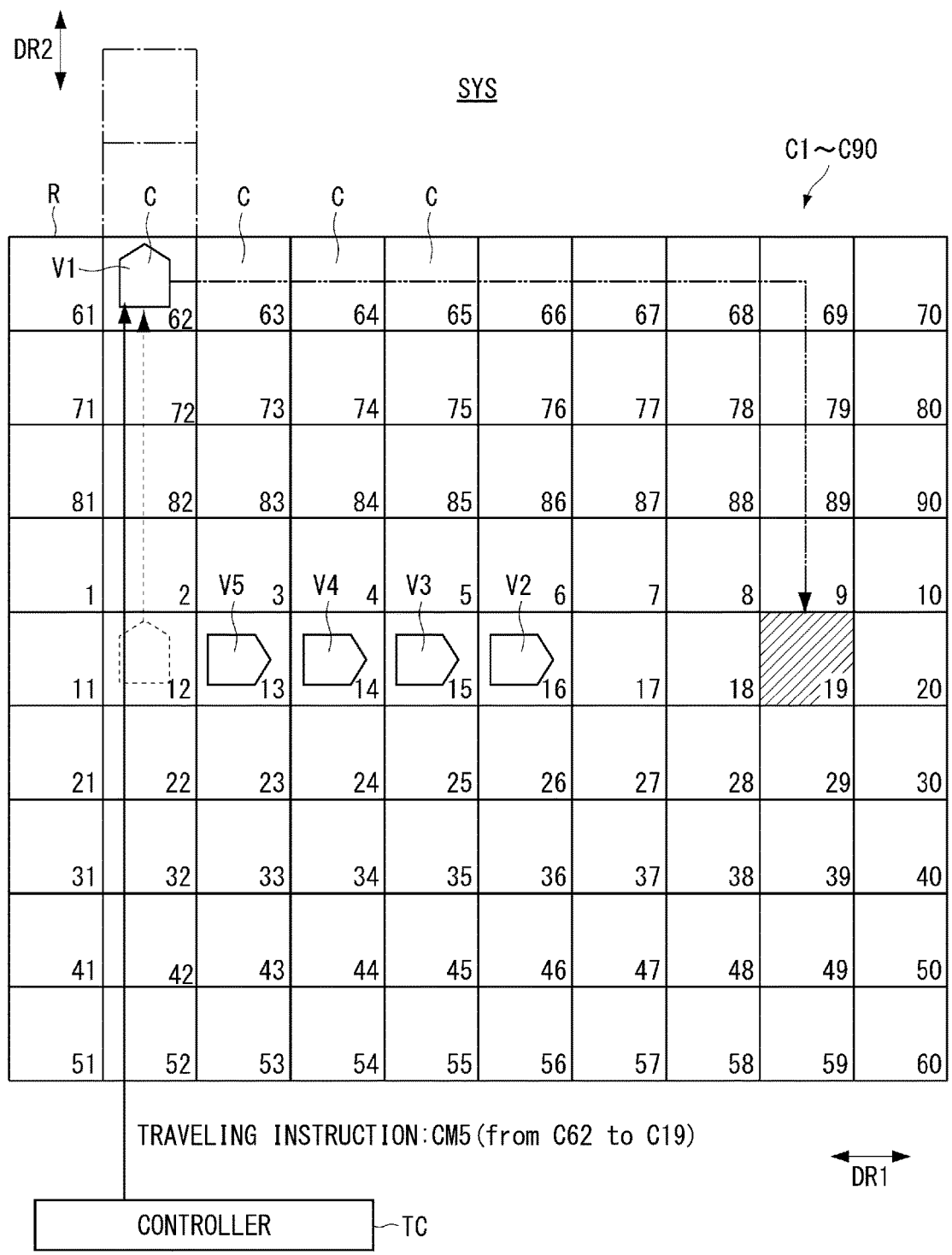
FIG. 13 is a diagram, which follows FIG. 12, and shows an example of operations of the traveling vehicles in the traveling vehicle system.

FIG. 11 is a flowchart showing another example of the traveling vehicle control method. FIGS. 12 and 13 are diagrams showing an example of the operation of the traveling vehicle system SYS. The processing of Step S12 is described. Processes similar to those described above are performed in Step S11 and Step S13. After Step S11, the determiner 67 of the controller TC determines whether or not a waypoint can be set in Step S12 (Step S21).

The traveling instruction generator 63 generates a traveling instruction CM in which a grid cell C in the second direction DR2 situated at preliminarily set 6 squares ahead of the grid cell C12 is set as a waypoint for the traveling vehicle V1. However, as shown in FIG. 12, depending on the layout of the grid-patterned track R, a grid cell C may not be present at 6 squares ahead of the grid cell C12 in the second direction DR2. Also, even if a grid cell C is present at 6 squares ahead, it may be unusable for reasons such as route closure due to maintenance work or the like. As described above, it may not be possible to specify a grid cell C to be a waypoint at preliminarily set 6 squares ahead.

In Step S21, the determiner 67 confirms whether or not a grid cell C is present at 6 squares ahead of the grid cell C12, or whether or not a grid cell C at 6 squares ahead of the grid cell C12 is usable. If the determiner 67 determines a grid cell C as being present at 6 squares ahead and the grid cell C as being usable (YES in Step S21), the traveling instruction generator 63 generates a traveling instruction CM in which the grid cell C is set as a waypoint. If no grid cell C is determined as being present at 6 squares ahead, or the grid cell C at 6 squares ahead of the grid cell C12 as being unusable, that is to say, if it is determined that a waypoint cannot be set (NO in Step S21), the determiner 67 specifies a grid cell C in the second direction DR2 situated at a second predetermined number, which is less than the first predetermined number, of cells (squares) ahead of the grid cell C12, where the traveling vehicle V1 has been in a stop state, as a waypoint (Step S22). This is an example in which, for example, there is no grid cell C present at or beyond 5 squares ahead of the grid cell C12 in the second direction DR2, as shown in FIG. 12.

Through the process of Step S22, the determiner 67 confirms whether or not a grid cell C is present at 5 squares ahead of the grid cell C12, using the second predetermined number (5), which is less than the first predetermined number (6). For example, the determiner 67 subtracts a preliminarily set value (1 in this example) from the first predetermined number to obtain the second predetermined number, where the value subtracted from the first predetermined number can be set arbitrarily. After Step S22, the process returns to Step S21 to determine whether or not a grid cell C is present at 5 squares ahead, that is, whether a waypoint can be set. As shown in FIG. 12, no grid cell C is present at 5 squares ahead of the grid cell C12 in the second direction DR2, and therefore, the determiner 67 determines that a waypoint cannot be set (NO in Step S21).

As shown in FIG. 11, following NO in Step S21, Step S22 is performed, and 4 obtained by subtracting 1 from the first predetermined number (5: the second predetermined number mentioned above) set in the previous Step S22 is set as the second predetermined number, to thereby specify the grid cell C at 4 squares ahead. After Step S22, the process returns to Step S21 to determine whether or not a grid cell C is present at 4 squares ahead. As shown in FIG. 12, the grid cell C62 is present at 4 squares ahead of the grid cell C12 in the second direction DR2, and therefore, the determiner 67 determines that a waypoint can be set (YES in Step S21).

If the determiner 67 determines that a waypoint can be set, the traveling instruction generator 63 generates a traveling instruction CM4 in which the grid cell C62 is set as a waypoint. As shown in FIG. 12, the assignor 64 assigns to the traveling vehicle V1 the traveling instruction CM4 that designates the grid cell C62 set in Step S22 as a waypoint (Step S14). The traveling vehicle V1 proceeds to the grid cell C62 according to the traveling instruction CM4.

As shown in FIG. 13, if the traveling vehicle V1 has reached (or approached) the grid cell C62 (YES in Step S15), the traveling instruction generator 63 generates a traveling instruction CM5 from the grid cell C62 to the grid cell C19, which is the destination of the traveling instruction CM1 that has been managed. As shown in FIG. 13, the traveling instruction CM5 is an instruction that instructs to proceed along, for example, the traveling route denoted by the two-dot chain line from the grid cell C62 to the grid cell C19. The assignor 64 assigns to the traveling vehicle V the generated traveling instruction CM5 (Step S16). After having proceeded in the first direction DR1 from the grid cell C62 and reached the grid cell C69, according to the traveling instruction CM5, the traveling vehicle V1 changes its traveling direction to the second direction DR2 at the grid cell C69 and then proceeds, and thereby the traveling vehicle V1 arrives at the grid cell C19, which is the original destination of the traveling vehicle V1. As described above, also in proceeding from the grid cell C92 to the grid cell C19, when proceeding from the current grid cell C (predetermined grid cell C) to the next grid cell C (adjacent grid cell C), the traveling vehicle V1 transmits an occupation permission request to the controller TC. Then, if occupation permission is obtained from the controller TC, the traveling vehicle V1 proceeds to the next grid cell C, whereas it stops at the current grid cell C if occupation permission is not obtained.

As described above, when causing the traveling vehicle V to proceed by changing the orientation thereof from the first direction DR1 to the second direction DR2, even if the number of grid cells C in the second direction DR2 is small, the traveling instruction CM4, in which a waypoint has been set, is assigned to the traveling vehicle V, and it is therefore possible to reliably cause the traveling vehicle V in a stop state to proceed from the grid cell C where it has been in the stop state.

Figure 14:
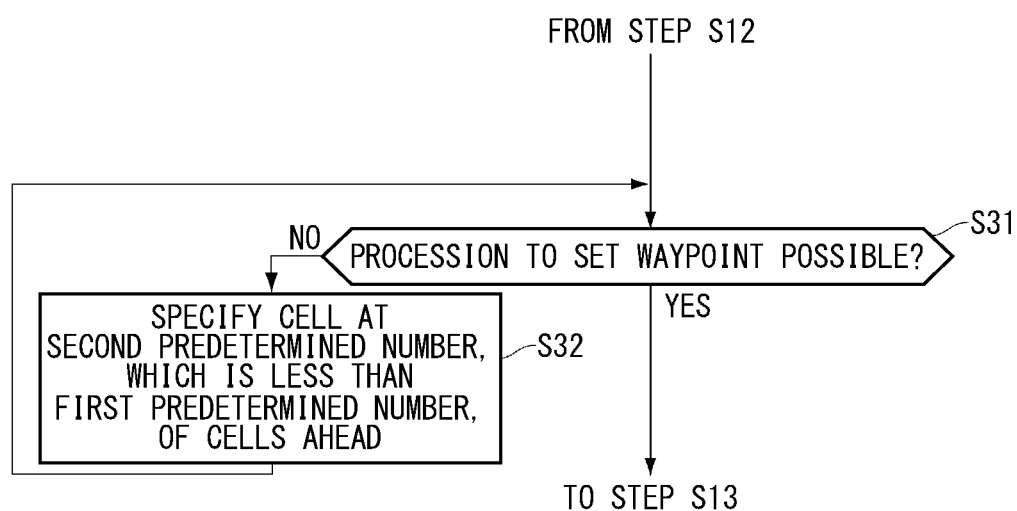
FIG. 14 is a flowchart showing another example of the traveling vehicle control method.
Figure 15:
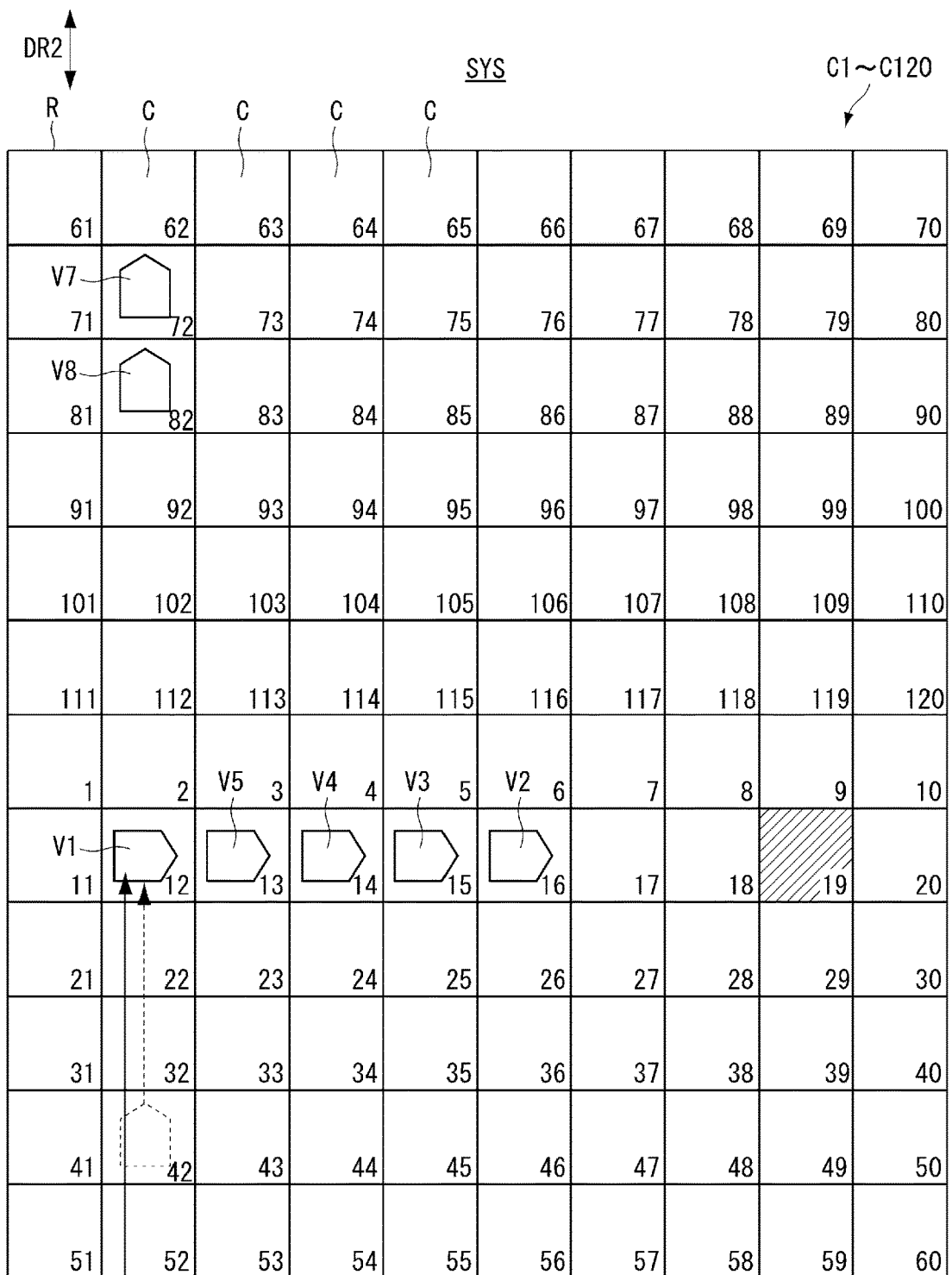
FIG. 15 is a diagram showing an example of operations of the traveling vehicles in the traveling vehicle system.

FIG. 13 is a flowchart showing another example of the traveling vehicle control method. FIGS. 14 and 15 are diagrams showing an example of the operation of the traveling vehicle system SYS. Processes similar to those described above are performed in Step S11 and Step S12. After Step S12, the determiner 67 of the controller TC determines whether or not the traveling vehicle V1 can travel to the grid cell C72, which has been set as a waypoint in Step S12 (Step S31).

In Step S31, the determiner 67 confirms whether or not each of the grid cells C (C2, C112, C102, C92, C82, C72) on the traveling route set by the traveling instruction CM is occupied by another traveling vehicle V, or whether or not occupation permission has already been granted to another traveling vehicle V for each of the grid cells C on the traveling route. If the determiner 67 determines that the grid cells C on the traveling route are not occupied by other traveling vehicles V or occupation permission has not been granted to another traveling vehicle V, it is determined that the traveling vehicle V1 can travel to the grid cell C72, which is a waypoint. If any of the grid cells C on the traveling route is occupied by another traveling vehicle V or occupation permission has been granted to another traveling vehicle V, it is determined that the traveling vehicle V1 cannot travel to the grid cell C72, which is a waypoint.

If the determiner 67 determines that the traveling vehicle V1 can proceed to the grid cell C72 (YES in Step S31), the controller TC performs the processes of Step S13 and thereafter as in the example described above. The traveling vehicle V1 proceeds to the grid cell C72. This process is similar to that described above in that the traveling vehicle V1 having proceeded to the grid cell C72 proceeds in the second direction DR2 to the grid cell C19, which is the destination, after having proceeded in the first direction DR1 to the grid cell C79 (see FIG. 10).

If the determiner 67 determines that the traveling vehicle V1 cannot proceed to the grid cell C72 (NO in Step S31), the traveling instruction generator 63 of the controller TC generates a traveling instruction in which a grid cell C in the second direction DR2 situated at a second predetermined number, which is less than the first predetermined number, of cells ahead of the grid cell C12, where the traveling vehicle V1 has been in a stop state, is designated as a waypoint (Step S32). This is an example in which, for example, the waypoint of the traveling vehicle V1 is the grid cell C72 and traveling vehicles V7, V8 are in a stop state at the grid cells C72, C82, as shown in FIG. 15.

Through the process of Step S32, the determiner 67 sets the grid cell C82 at 5 squares ahead as a waypoint, using the second predetermined number (5), which is less than the first predetermined number (6). For example, the determiner 67 subtracts a preliminarily set value (1 in this example) from the first predetermined number to thereby obtain the second predetermined number, where the value subtracted from the first predetermined number can be set arbitrarily. After Step S32, the process returns to Step S31 to determine whether or not the traveling vehicle V1 can proceed to the grid cell C82 of the waypoint. Since the traveling vehicle V8 is in a stop state at the grid cell C82 as shown in FIG. 15, the determiner 67 determines that the traveling vehicle V1 cannot proceed to the grid cell C82 (NO in Step S31).

As shown in FIG. 14, following NO in Step S31, Step S32 is performed, and 4 obtained by subtracting 1 from the first predetermined number (5: the second predetermined number mentioned above) set in the previous Step S32 is set as the second predetermined number, to thereby set the grid cell C92 at 4 squares ahead as a waypoint. After Step S32, the process returns to Step S31 to determine whether or not the traveling vehicle V1 can proceed to the grid cell C92 of the waypoint. Since no traveling vehicle V is in a stop state at the grid cells C2 to the grid cell C92 as shown in FIG. 15, the determiner 67 determines that the traveling vehicle V1 can proceed to the grid cell C92 (YES in Step S31).

If proceeding to the grid cell C92 is possible, the traveling instruction generator 63 cancels the traveling instruction CM1 to the destination that has been assigned to the traveling vehicle V1 while still maintaining the traveling instruction CM1 under management of its own (or of the controller TC) (Step S13). As shown in FIG. 15, the assignor 64 assigns to the traveling vehicle V1 a traveling instruction CM6 that designates the grid cell C92 set in Step S32 as a waypoint (Step S14). The traveling vehicle V1 proceeds to the grid cell C92 according to the traveling instruction CM6.

Figure 16:
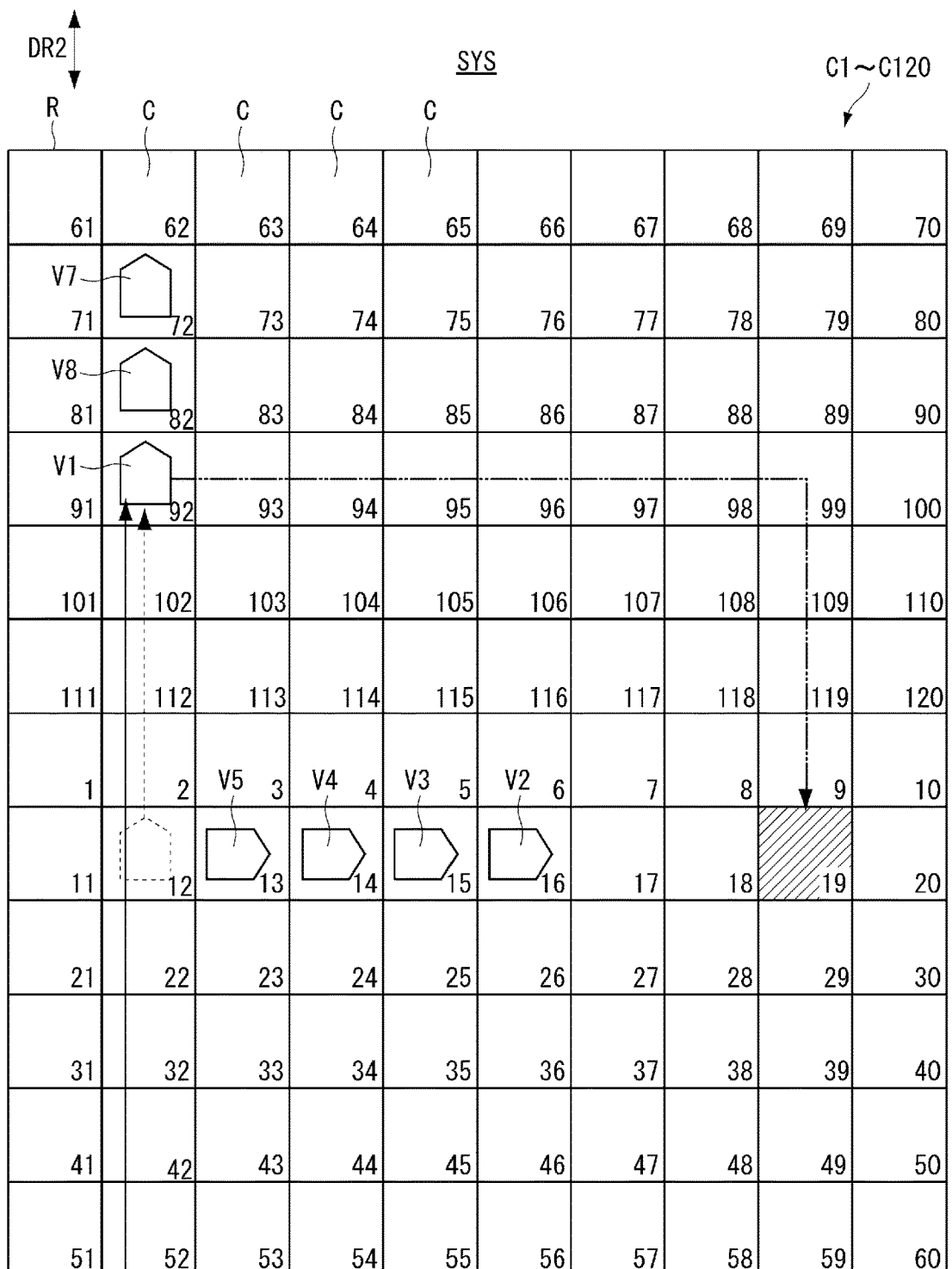
FIG. 16 is a diagram, which follows FIG. 15, and shows an example of operations of the traveling vehicles in the traveling vehicle system.

As shown in FIG. 16, if the traveling vehicle V1 has reached (or approached) the grid cell C92 (YES in Step S15), the traveling instruction generator 63 generates a traveling instruction CM7 from the grid cell C92 to the grid cell C19, which is the destination of the traveling instruction CM1 that has been managed. As shown in FIG. 16, the traveling instruction CM7 is an instruction that instructs to proceed along, for example, the traveling route denoted by the two-dot chain line from the grid cell C92 to the grid cell C19. The assignor 64 assigns to the traveling vehicle V the generated traveling instruction CM7 (Step S16). After having proceeded in the first direction DR1 from the grid cell C92 and reached the grid cell C99, according to the traveling instruction CM7, the traveling vehicle V1 changes its traveling direction to the second direction DR2 at the grid cell C99 and then proceeds, and thereby the traveling vehicle V1 arrives at the grid cell C19, which is the original destination of the traveling vehicle V1. As described above, also in proceeding from the grid cell C92 to the grid cell C19, when proceeding from the current grid cell C (predetermined grid cell C) to the next grid cell C (adjacent grid cell C), the traveling vehicle V1 transmits an occupation permission request to the controller TC. Then, if occupation permission is obtained from the controller TC, the traveling vehicle V1 proceeds to the next grid cell C, whereas it stops at the current grid cell C if occupation permission is not obtained.

As described above, when causing the traveling vehicle V to proceed by changing the orientation thereof from the first direction DR1 to the second direction DR2, if the traveling vehicle V is unable to proceed to the grid cell C of the waypoint at the first predetermined number of cells ahead, a traveling instruction in which the grid cell C situated at the second predetermined number, which is less than the first predetermined number, of cells ahead is assigned to the traveling vehicle V, and it is therefore possible to reliably cause the traveling vehicle V in a stop state to proceed from the grid cell C where it has been in the stop state.

An example has been described above. However, the technical scope of our systems and methods are not limited to the description of the above example. It is also apparent to those skilled in the art that various modifications or improvements can be added to the above example. The technical scope of this disclosure also encompasses one or more of such modifications or improvements. One or more of the requirements described in the above example may be omitted in some instances. One or more of the requirements described in the above example may be combined where appropriate. The order of executing processes shown in the example can be realized in an arbitrary order unless an output of the previous processing is used in the following processing. While operations in the above example have been described with expressions such as "first," "next" or "subsequently" for the sake of convenience, the operations need not always be implemented in that order.

Furthermore, in the example described above, the description has been made in which, of the second direction DR2, the direction toward the upper side of each figure has been taken as an example of the direction in which the traveling vehicle V travels, in those configurations where the traveling vehicle V continues to be in a stop state at a grid cell C for a predetermined period of time. However, this disclosure is not limited to this example. For example, the direction in which the traveling vehicle V travels may be the direction toward the lower side of each figure, of the second direction DR2.

One or more of the requirements described in the above examples may be omitted. One or more of the requirements described in the above examples may be combined where appropriate. The contents of Japanese Patent Application No. 2019-130470 and all documents cited herein are incorporated herein by reference.

The invention claimed is:

1. A traveling vehicle system comprising:
  a plurality of traveling vehicles;
  a track in which a plurality of first tracks extending in a first direction and a plurality of second tracks extending in a second direction intersecting with the first direction are provided in a grid pattern, and on which the traveling vehicles can selectively proceed either in the first direction or in the second direction; and
  a controller capable of communicating mutually with the plurality of traveling vehicles and that controls the plurality of traveling vehicles,
  wherein the controller can set either an occupied state in which occupation permission is granted to a predetermined traveling vehicle or an unoccupied state in which occupation permission is not granted to any traveling vehicle to each cell that is defined by two first tracks adjacent to each other and two second tracks adjacent to each other as seen in a plan view,
  the controller determines, when the traveling vehicle that is to proceed in the first direction from the predetermined cell toward a destination is present, whether or not to grant the traveling vehicle occupation permission for the cell adjacent to the predetermined cell in the first direction,
  the traveling vehicle proceeds in the first direction if occupation permission for the adjacent cell has been granted from the controller, whereas the traveling vehicle stops at the predetermined cell if occupation permission has not been granted,
  the controller assigns to the traveling vehicle a traveling instruction in which the cell situated at a first predetermined number, which is more than one, of cells ahead of the predetermined cell in the second direction is designated as a waypoint to the destination if the traveling vehicle has not obtained occupation permission for the adjacent cell and has continuously been in a stop state at the predetermined cell for a predetermined period of time,
  when assigning the traveling instruction to the traveling vehicle, a traveling instruction is assigned to the traveling vehicle in which the cell situated at a second predetermined number, which is less than the first predetermined number, of cells ahead of the predetermined cell in the second direction if the cell is not present at the first predetermined number of cells ahead of the predetermined cell in the second direction, or if another traveling vehicle is present between the predetermined cell and the cell situated at the first predetermined number of cells ahead thereof in the second direction, and
  the second predetermined number is a maximum number by which the traveling vehicle can proceed from the predetermined cell in the second direction.

2. The traveling vehicle system according to claim 1, wherein
  when the traveling vehicle has not obtained occupation permission for the adjacent cell and has continuously been in a stop state at the predetermined cell for a predetermined period of time, the controller cancels a traveling instruction to the destination that has been assigned to the traveling vehicle while maintaining the traveling instruction under management of its own.

3. The traveling vehicle system according to claim 2, wherein
  when the traveling vehicle has reached or approached the waypoint, the controller assigns to the traveling vehicle a traveling instruction from the waypoint to the destination designated in the canceled traveling instruction.

4. A traveling vehicle control method for controlling a traveling vehicle in a traveling vehicle system including
  a plurality of traveling vehicles, and
  a track in which a plurality of first tracks extending in a first direction and a plurality of second tracks extending in a second direction intersecting with the first direction are provided in a grid pattern, and on which the traveling vehicles can selectively proceed either in the first direction or in the second direction,
  the method comprising:
  setting either an occupied state in which occupation permission is granted to a predetermined traveling vehicle or an unoccupied state in which occupation permission is not granted to any traveling vehicle to each cell that is defined by two first tracks adjacent to each other and two second tracks adjacent to each other as seen in a plan view;
  determining, when the traveling vehicle that is to proceed in the first direction from the predetermined cell toward a destination is present, whether or not to grant the traveling vehicle occupation permission for the cell adjacent to the predetermined cell in the first direction;
  causing the traveling vehicle to proceed in the first direction if occupation permission for the adjacent cell has been granted to the traveling vehicle, and causing the traveling vehicle to stop at the predetermined cell if occupation permission for the adjacent cell has not been granted to the traveling vehicle; and
  assigning to the traveling vehicle a traveling instruction in which the cell situated at a first predetermined number, which is more than one, of cells ahead of the predetermined cell in the second direction is designated as a way point to the destination if the traveling vehicle has not obtained occupation permission for the adjacent cell and has continuously been in a stop state at the predetermined cell for a predetermined period of time, wherein when assigning the traveling instruction to the traveling vehicle, a traveling instruction is assigned to the traveling vehicle in which the cell situated at a second predetermined number, which is less than the first predetermined number, of cells ahead of the predetermined cell in the second direction if the cell is not present at the first predetermined number of cells ahead of the predetermined cell in the second direction, or if another traveling vehicle is present between the predetermined cell and the cell situated at the first predetermined number of cells ahead thereof in the second direction, and the second predetermined number is a maximum number by which the traveling vehicle can proceed from the predetermined cell in the second direction.

* * * * *